US009893461B2

(12) United States Patent
Wu

(10) Patent No.: US 9,893,461 B2
(45) Date of Patent: Feb. 13, 2018

(54) CONTINUABLE WATERPROOF CABLE, CONTINUABLE WATERPROOF POWER MODULE, AND WATERPROOF TERMINAL ASSEMBLY

(71) Applicant: Chun-Hung Wu, New Taipei (TW)

(72) Inventor: Chun-Hung Wu, New Taipei (TW)

( * ) Notice: Subject to any disclaimer, the term of this patent is extended or adjusted under 35 U.S.C. 154(b) by 465 days.

(21) Appl. No.: 14/640,724

(22) Filed: Mar. 6, 2015

(65) Prior Publication Data

US 2015/0263448 A1 Sep. 17, 2015

(30) Foreign Application Priority Data

Mar. 14, 2014 (TW) ............................ 103109378 A

(51) Int. Cl.

| | |
|---|---|
| ***H05K 7/00*** | (2006.01) |
| ***H01B 7/06*** | (2006.01) |
| ***H01B 7/18*** | (2006.01) |
| ***H01R 13/52*** | (2006.01) |
| ***H01R 13/40*** | (2006.01) |
| ***H01R 13/523*** | (2006.01) |
| ***H01R 24/38*** | (2011.01) |

(Continued)

(52) U.S. Cl.

CPC ....... *H01R 13/523* (2013.01); *H01R 13/5219* (2013.01); *H01R 24/38* (2013.01); *H01B 7/06* (2013.01); *H01B 7/14* (2013.01); *H01R 13/52* (2013.01); *H01R 24/40* (2013.01)

(58) Field of Classification Search

CPC ...... H01R 13/52; H01R 13/523; H01R 24/40; H01R 13/5219; H01R 24/38; H01B 7/14; H01B 7/06

USPC ........... 174/107, 69; 361/728; 439/271, 283, 439/587

See application file for complete search history.

(56) References Cited

U.S. PATENT DOCUMENTS 2,509,524 A * 5/1950 Pouzet .................. H02G 15/14 138/89
3,260,983 A * 7/1966 Daum ................. H01B 17/306 174/138 F (Continued)

FOREIGN PATENT DOCUMENTS

TW 408054 B 10/2000
TW 427044 3/2001

(Continued)

*Primary Examiner* — William H Mayo, III
*Assistant Examiner* — Rhadames J Alonzo Miller
(74) *Attorney, Agent, or Firm* — Muncy, Geissler, Olds & Lowe, P.C.

(57) ABSTRACT

A continuable waterproof cable includes a cable body, first, second and third transmitting members, and first and second waterproof elastic members. The cable body has a connecting end and a continuing end opposite to the connecting end. The first transmitting member and the first waterproof elastic member are disposed at the connecting end. The second transmitting member is disposed at the continuing end, coupled to the first transmitting member, and adapted to a first end of the first transmitting member. The second waterproof elastic member is disposed at the continuing end. The third transmitting member is in the cable body and has a fixed end and a free end. The fixed end is at the continuing end, the free end is detachably coupled to the first transmitting member and capable to be apart from the transmitting member by a force.

31 Claims, 16 Drawing Sheets

(51) Int. Cl.
*H01B 7/14* (2006.01)
*H01R 24/40* (2011.01)

(56) References Cited

U.S. PATENT DOCUMENTS

| | | | | | |
|---|---|---|---|---|---|
| 4,606,603 | A * | 8/1986 | Cairns | G02B 6/3816 174/70 R |
| 5,120,268 | A * | 6/1992 | Gerrans | H01R 13/523 439/278 |
| 5,210,374 | A * | 5/1993 | Channell | G02B 6/4444 174/38 |
| 5,362,258 | A * | 11/1994 | Arnswald | H01R 13/521 439/271 |
| 5,480,315 | A * | 1/1996 | Martinelli | H01R 13/5221 439/271 |
| 5,785,544 | A * | 7/1998 | Linden | H01R 13/622 439/277 |
| 6,040,527 | A * | 3/2000 | De Buyst | H02G 15/103 174/88 C |
| 7,175,459 | B2 * | 2/2007 | Milner | H01R 13/5213 439/271 |
| 7,195,505 | B1 * | 3/2007 | Becker | H01R 13/5219 439/271 |
| 7,207,820 | B1 * | 4/2007 | Montena | H01R 13/5219 439/275 |
| 8,485,846 | B2 * | 7/2013 | Jackson | H01R 43/005 439/584 |
| 9,203,182 | B2 * | 12/2015 | Fawcett | H01R 13/53 |
| 2008/0194137 | A1 * | 8/2008 | Kuo | H01R 13/5205 439/489 |

FOREIGN PATENT DOCUMENTS

| | | |
|---|---|---|
| TW | M318226 U | 9/2007 |
| TW | M393092 | 11/2010 |
| TW | M461905 | 9/2013 |
| TW | M472958 U | 2/2014 |
| TW | M82149 | 7/2014 |

* cited by examiner

600

CONTINUABLE WATERPROOF CABLE, CONTINUABLE WATERPROOF POWER MODULE, AND WATERPROOF TERMINAL ASSEMBLY

CROSS-REFERENCES TO RELATED APPLICATIONS

This non-provisional application claims priority under 35 U.S.C. §119(a) on Patent Application No. 103109378 filed in Taiwan, R.O.C. on 2014 Mar. 14, the entire contents of which are hereby incorporated by reference.

BACKGROUND

Technical Field

The instant disclosure relates to a waterproof terminal, in particular, to a continuable waterproof cable, a continuable waterproof power module, and a waterproof terminal assembly.

Related Art

With the advancement of technology, instead of looking up dictionary, books, newspapers, or magazines, many people may use computers or smart phones finding information. Besides, not only talking in a face-to-face manner, people gradually use communication software and apps to chat with their friend. Telecommunication transmission technologies become a kind of necessity in daily life.

To accomplish the telecommunication transmissions among different countries, conventional submarine cables are connected between the telecommunication transmission systems among different countries. Accordingly, the communication system (including network and telecommunication systems) are established among countries. However, the conventional submarine cables may be damaged by the anchors or the trawls of fish boats or by aquatic animals or plants. The damaged parts of the conventional submarine cables have to be dragged out of the water in advance before the conventional submarine cables are to be repaired. Alternatively, the repairmen have to take on the repair ship particularly manufactured for repairing the conventional submarine cables. Accordingly, the procedure for repairing the conventional submarine cables is complicated and costly.

SUMMARY

In one implementation aspect, a continuable waterproof cable is provided and comprises a cable body, a first transmitting member, a first waterproof elastic member, a second transmitting member, a second waterproof elastic member, and a third transmitting member. The cable body has a connecting end and a continuing end opposite to the connecting end. The first transmitting member has a first end and a second end. The first end is exposed out of the connecting end. The first waterproof elastic member is disposed at the connecting end. The second transmitting member is disposed at the continuing end. The second transmitting member is coupled to the first transmitting member, and the second transmitting member is adapted to the first end of the first transmitting member. The second waterproof elastic member is disposed at the continuing end. The third transmitting member is in the cable body. The third transmitting member has a fixed end and a free end. The fixed end is at the continuing end, the free end is detachably coupled to the first transmitting member, and the free end is capable to be apart from the transmitting member by a force.

In one implementation aspect, a waterproof terminal assembly is provided and comprises a male terminal and a female terminal. The male terminal comprises a male terminal body, a first waterproof elastic member, a first socket, a first securing portion, a first transmitting member, and a free transmitting member. The first waterproof elastic member is disposed at an end portion of the male terminal body. The first socket is fitted over the outer periphery of the male terminal body. The first securing portion is defined around the inner wall of the first socket. The first transmitting portion is disposed at the end portion of the male terminal body. The free transmitting member is disposed at the end portion of the male terminal body and detachably coupled to the first transmitting member. The female terminal comprises a female terminal body, a second waterproof elastic member, a second socket, a second securing portion, a second transmitting member, and a fixed transmitting member. The second waterproof elastic member is disposed at an end portion of the female terminal body. The second socket is fitted over the outer periphery of the female terminal body, and the inner diameter of the first socket is substantially equal to the outer diameter of the second socket. The second securing portion is defined around the outer wall of the second socket. The second transmitting member is disposed at the end portion of the female terminal body, and the second transmitting member is adapted to be coupled with the first transmitting member. The fixed transmitting member is disposed at the end portion of the female terminal body and spaced from the second transmitting member. Wherein, when the male terminal is connected to the female terminal, the first transmitting member is connected to the second transmitting member, and the second transmitting member pushes the free transmitting member apart from the first transmitting member so that the free transmitting member is coupled to the fixed transmitting member, the first waterproof elastic member is attached to the end portion of the female terminal body, and the second waterproof elastic member is attached to the end portion of the male terminal body.

In one implementation aspect, a continuable waterproof power module is provided and comprises a housing, a battery core, and the waterproof terminal assembly. The battery core is received in the housing. The male terminal is disposed at a first side of the housing, the female terminal is disposed at the first side or a second side of the housing, wherein the second side is not opposite to the first side. The male terminal and the female terminal are electrically connected to the battery core.

Based on the above, the workload, the cost, and the time for assembling and repairing the submarine cables can be reduced by the waterproof feature provided by the continuable waterproof cable. In addition, the waterproof terminal assembly can be adapted to couple with the continuable waterproof cable or the continuable waterproof power module. Accordingly, transmission of electrical signals, optical signals, acoustic signals, electricity signals, or network signals can be achieved, by connecting the continuable waterproof cable in sequence.

Detailed description of the characteristics and the advantages of the disclosure is shown in the following embodiments, the technical content and the implementation of the disclosure should be readily apparent to any person skilled in the art from the detailed description, and the purposes and the advantages of the disclosure should be readily understood by any person skilled in the art with reference to content, claims and drawings in the disclosure.

BRIEF DESCRIPTION OF THE DRAWINGS

The instant disclosure will become more fully understood from the detailed description given herein below for illustration only, and thus not limitative of the instant disclosure, wherein.

DETAILED DESCRIPTION

Figure 1A:
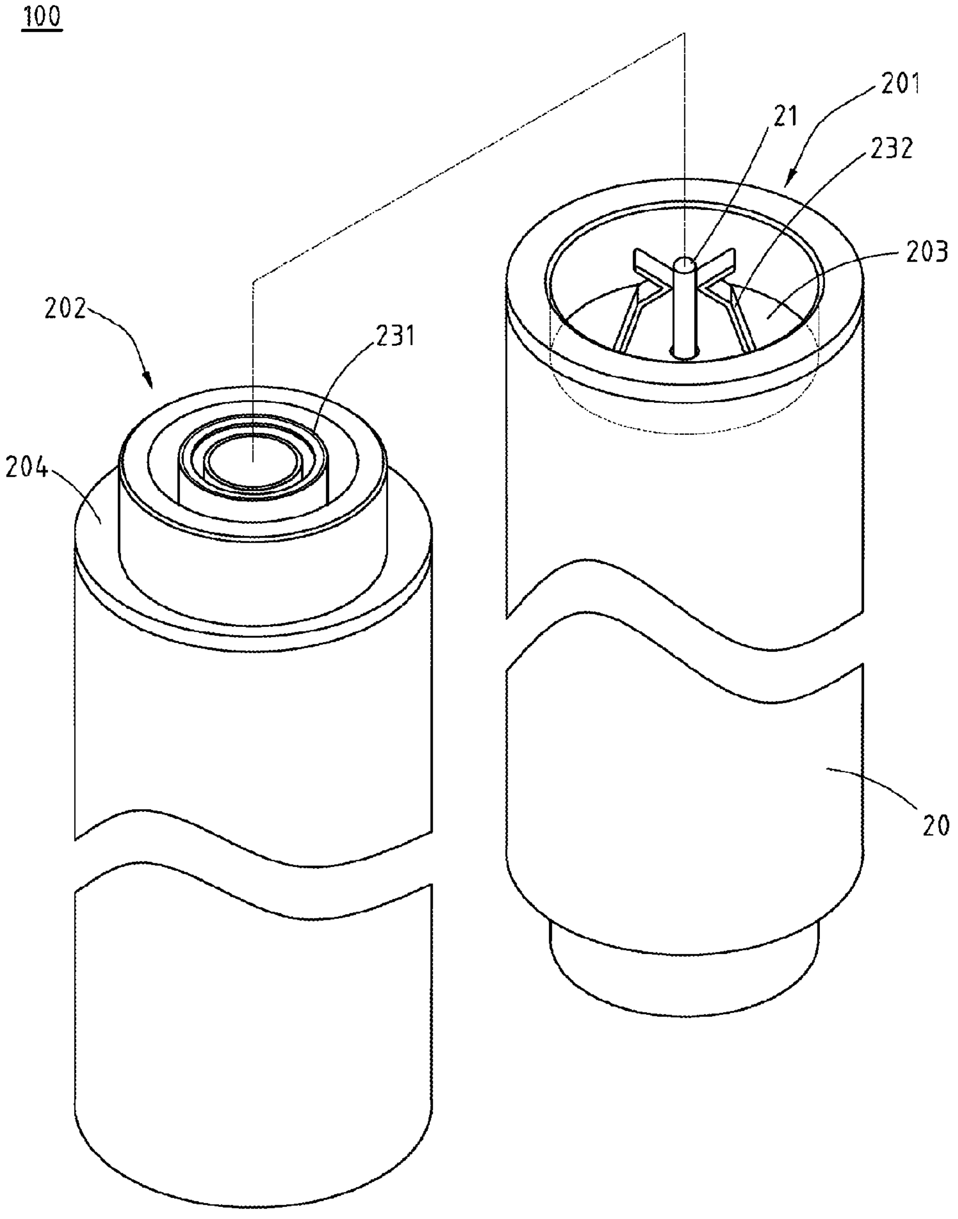
FIG. 1A illustrates a perspective view of a first embodiment of a continuable waterproof cable according to the instant disclosure.
Figure 1B:
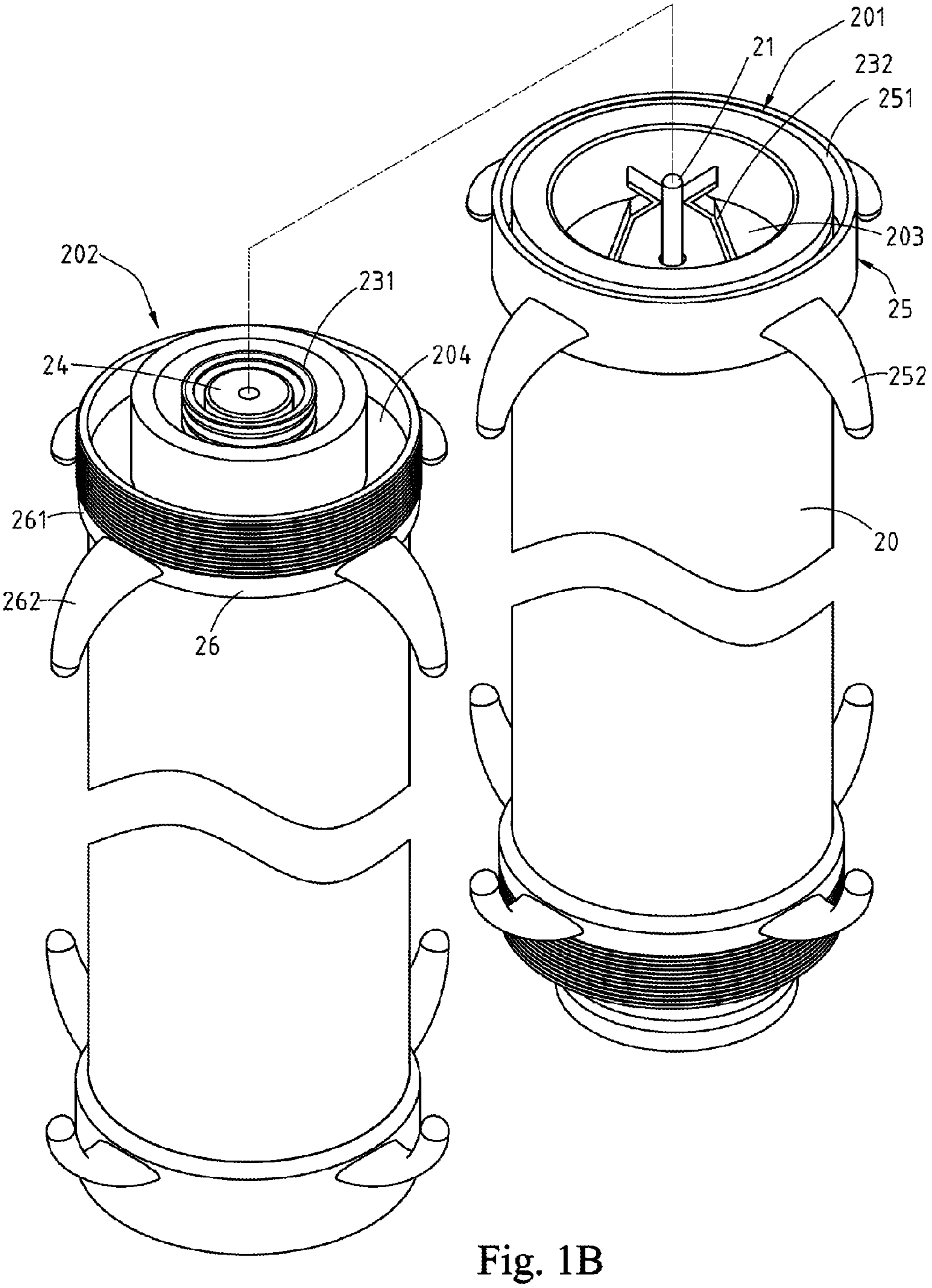
FIG. 1B illustrates a perspective view of the first embodiment of the continuable waterproof cable according to the instant disclosure, for one variation.
Figure 1C:
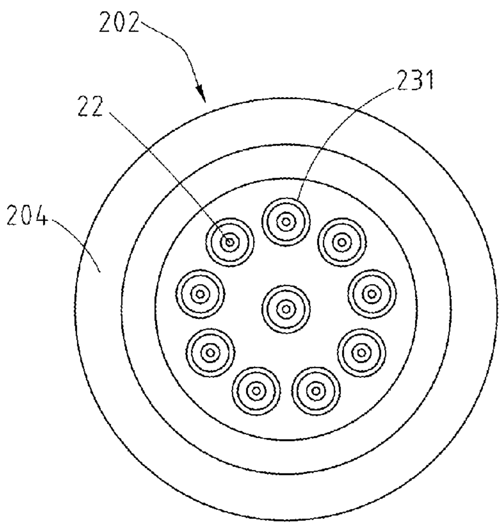
FIG. 1C illustrates a top view of a continuing end of the first embodiment of the continuable waterproof cable according to the instant disclosure, for one variation.
Figure 1D:
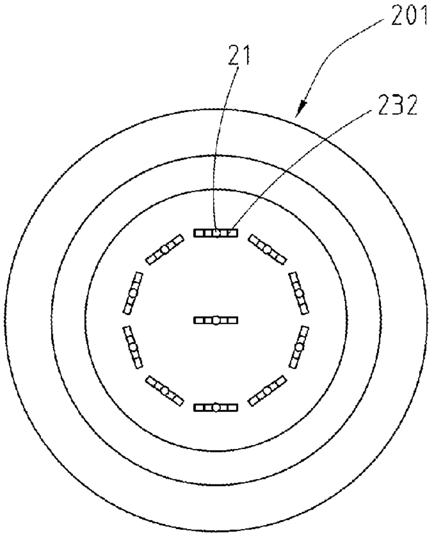
FIG. 1D illustrates a top view of a connecting end of the first embodiment of the continuable waterproof cable according to the instant disclosure, for one variation.
Figure 2A:
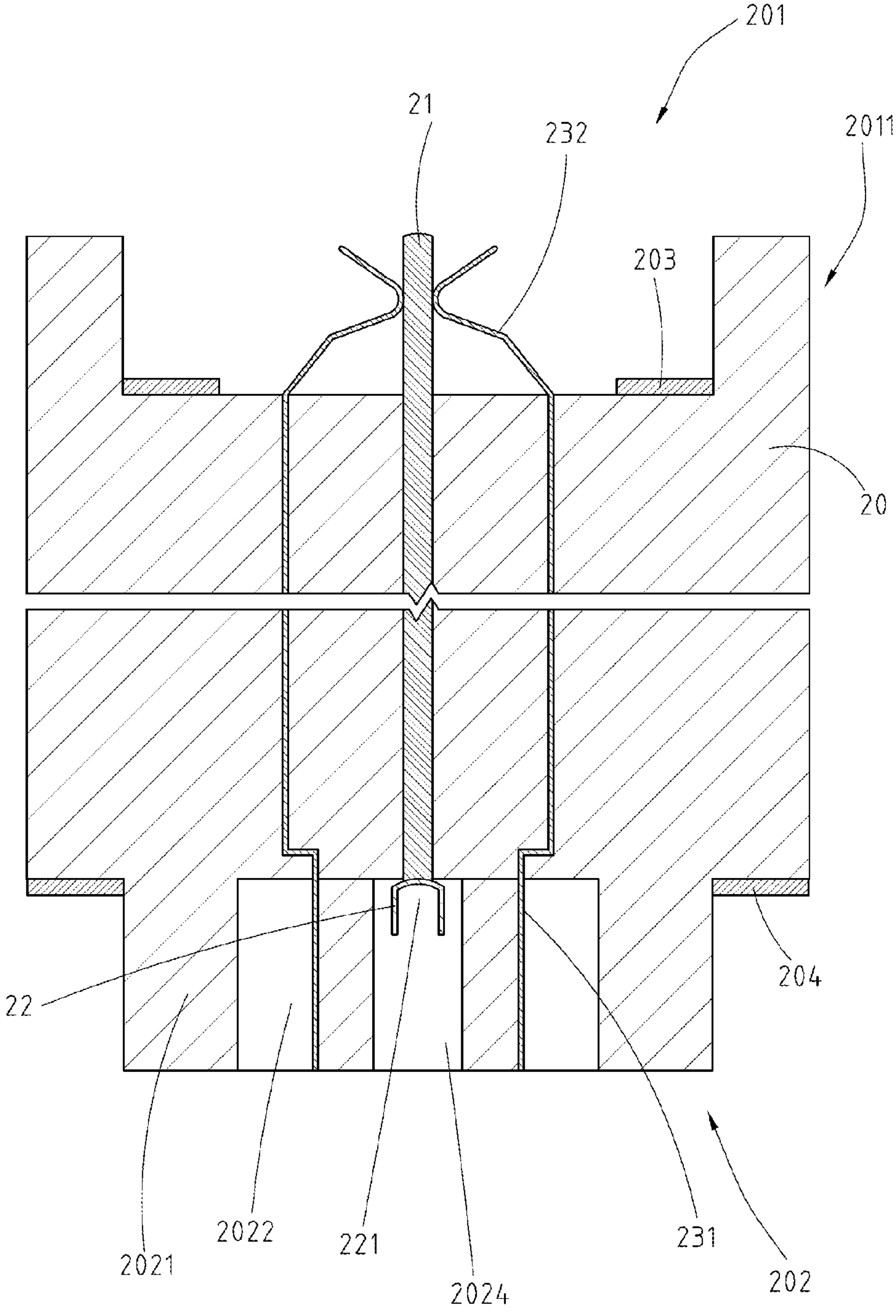
FIG. 2A illustrates a cross-sectional view of the first embodiment of the continuable waterproof cable according to the instant disclosure.
Figure 2B:
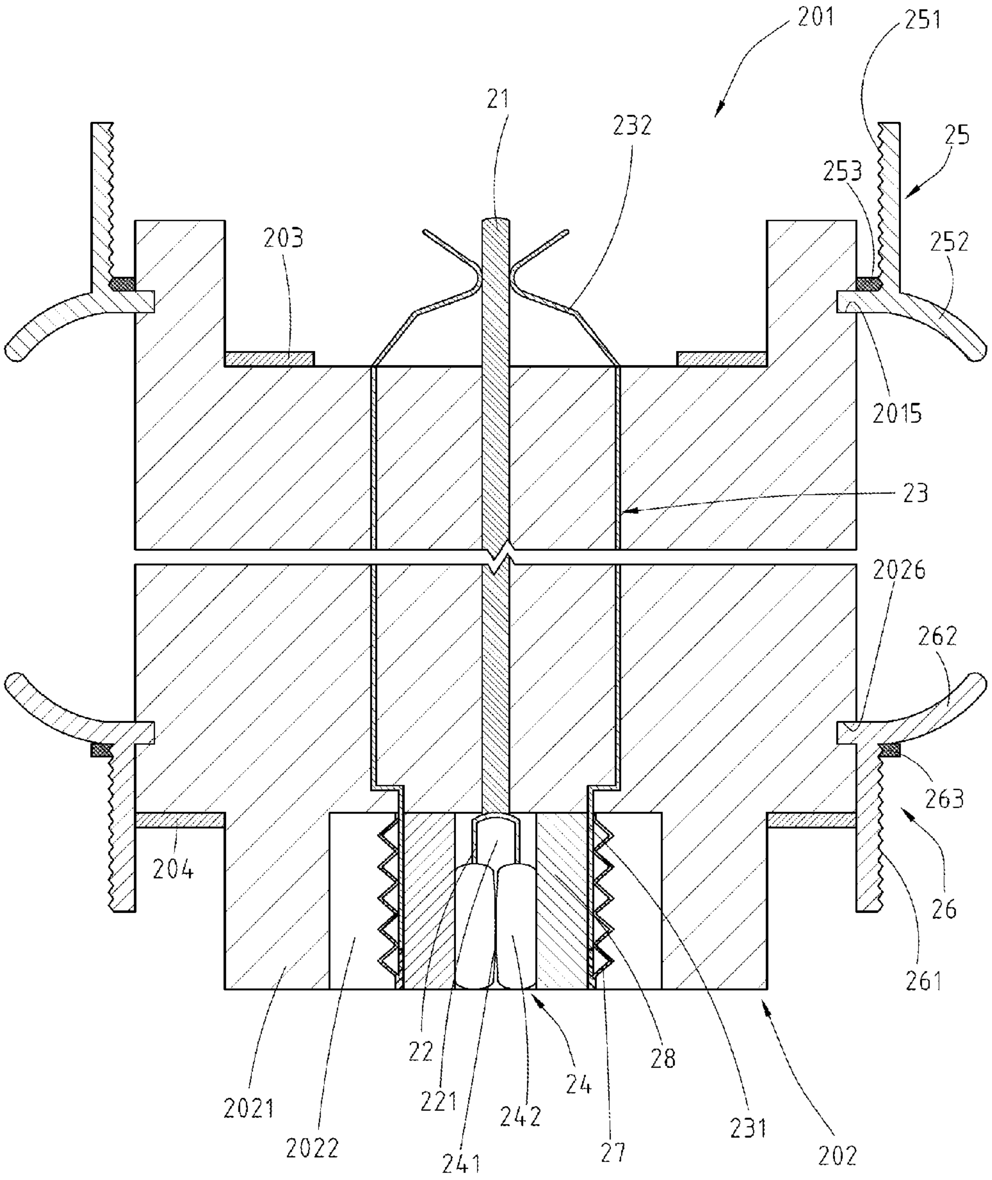
FIG. 2B illustrates a cross-sectional view of the first embodiment of the continuable waterproof cable according to the instant disclosure, for one variation.
Figure 2C:
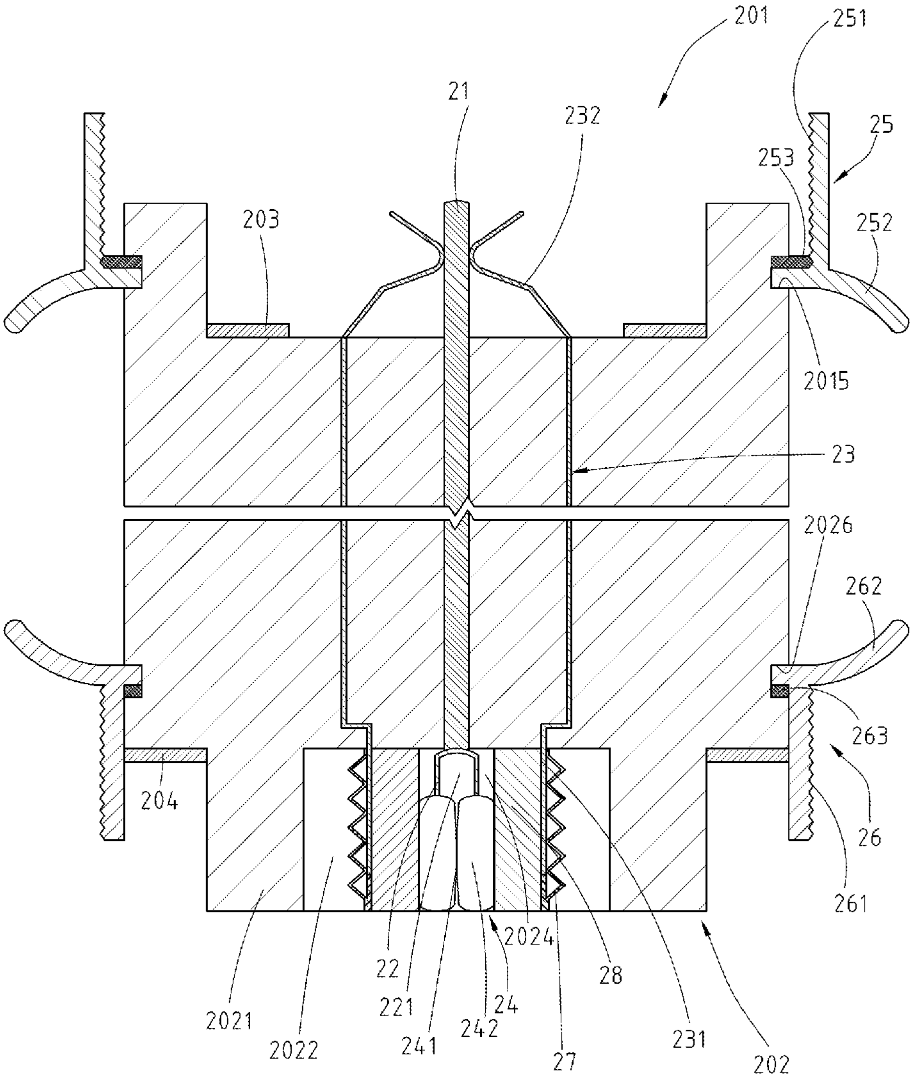
FIG. 2C illustrates a cross-sectional view of the first embodiment of the continuable waterproof cable according to the instant disclosure, for another variation.
Figure 2D:
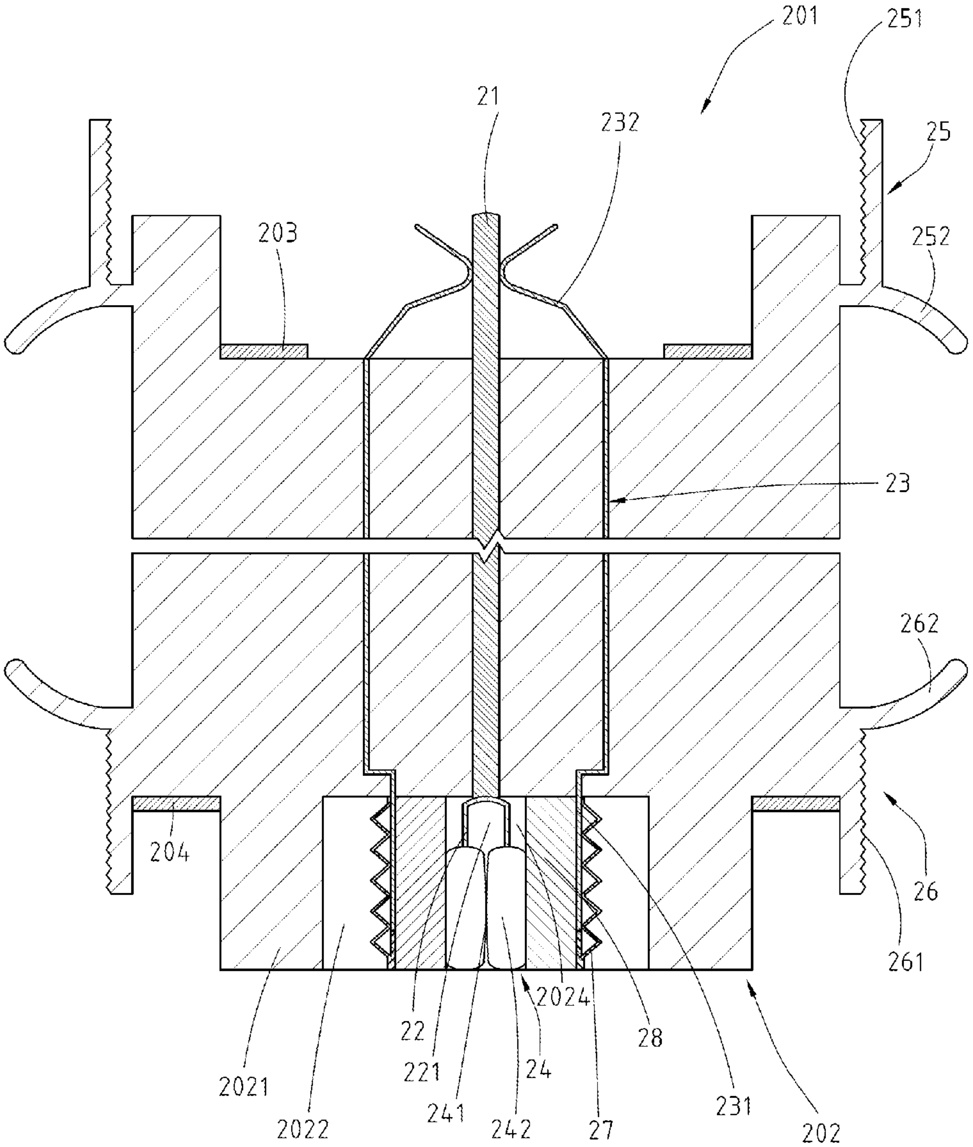
FIG. 2D illustrates a cross-sectional view of the first embodiment of the continuable waterproof cable according to the instant disclosure, for yet another variation.
Figure 3A:
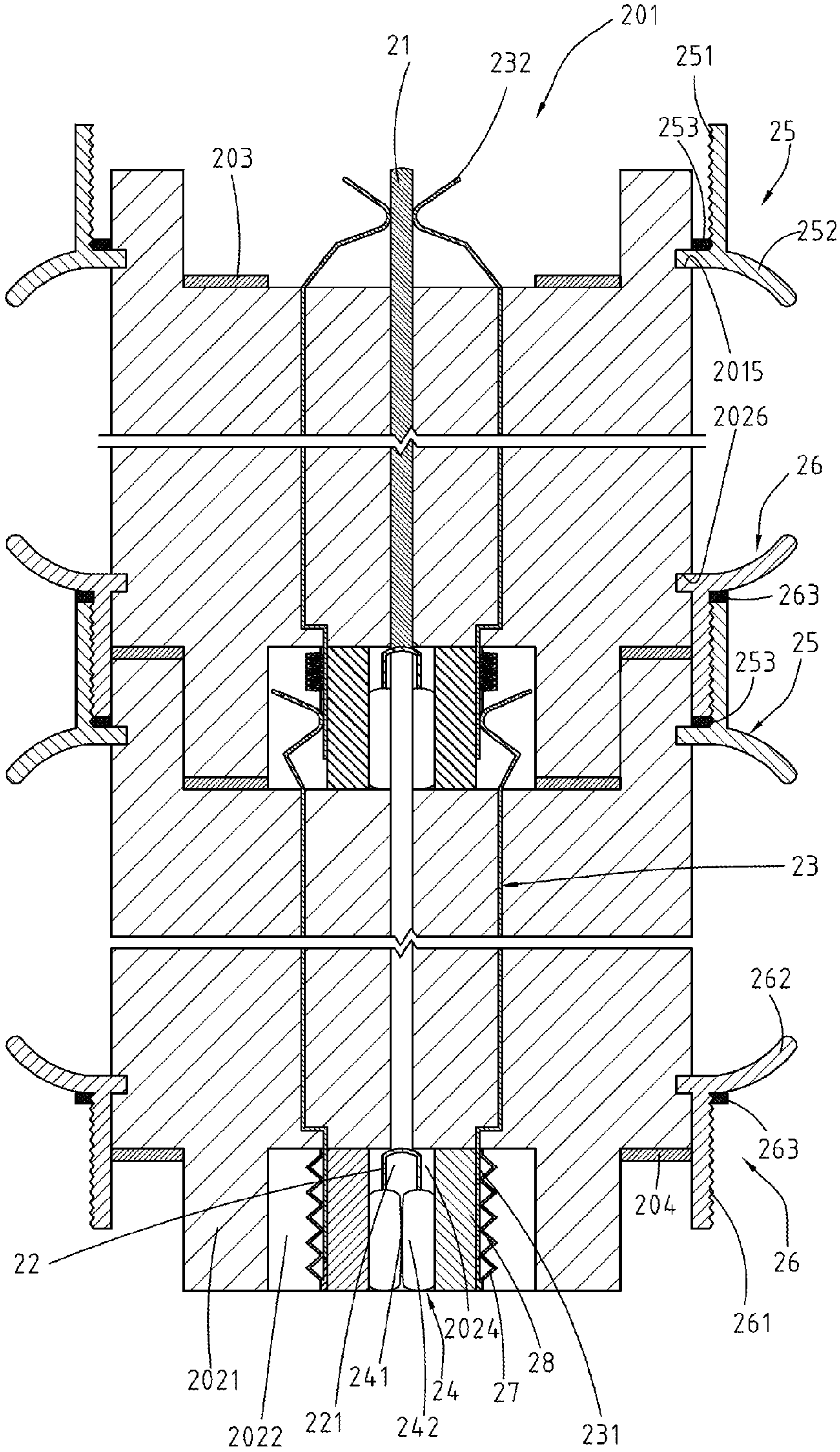
FIG. 3A is a schematic view illustrating two continuable waterproof cables according to the instant disclosure are connected with each other.
Figure 3B:
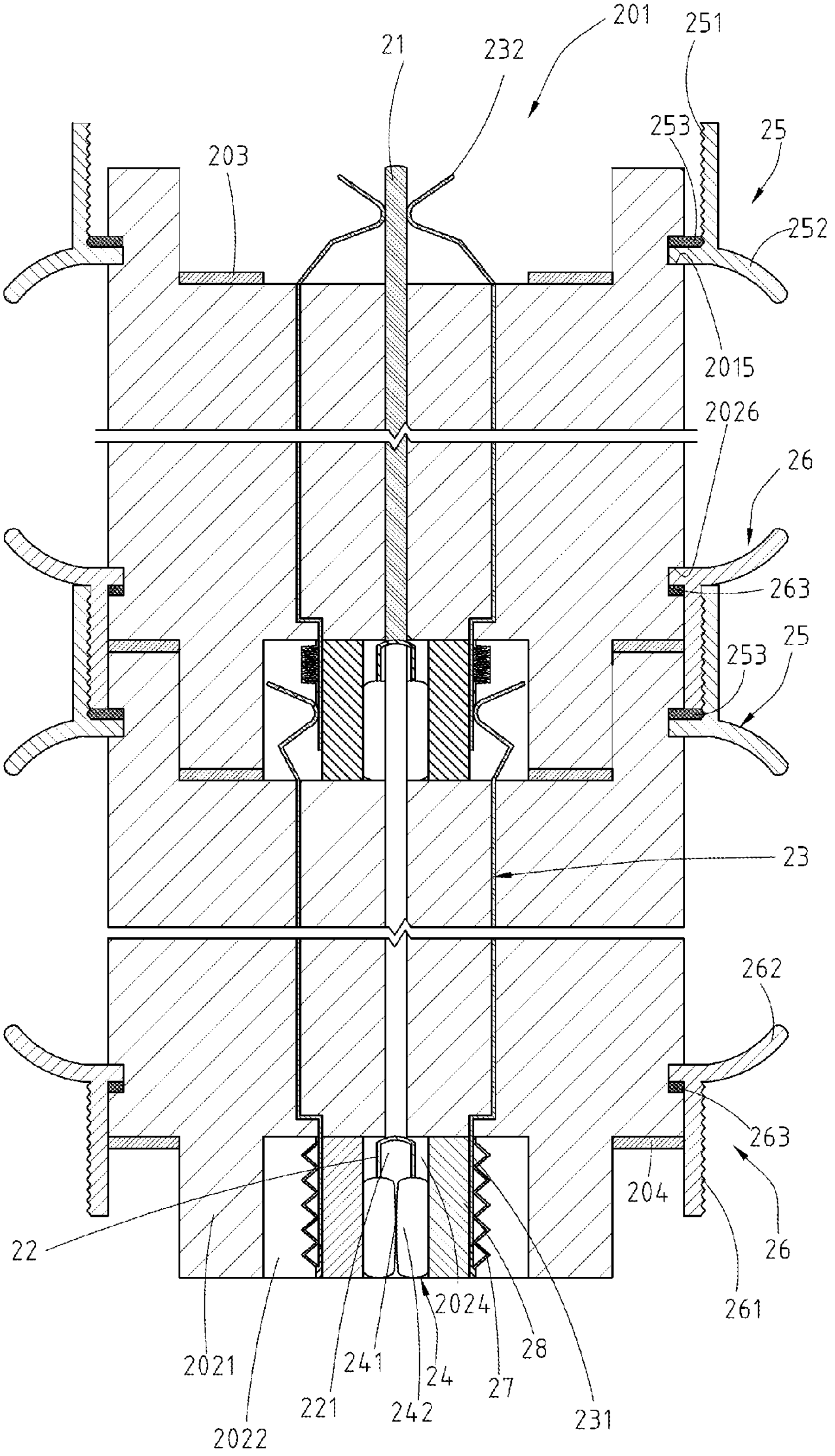
FIG. 3B is a schematic view illustrating two continuable waterproof cables connected with each other according to the instant disclosure.
Figure 3C:
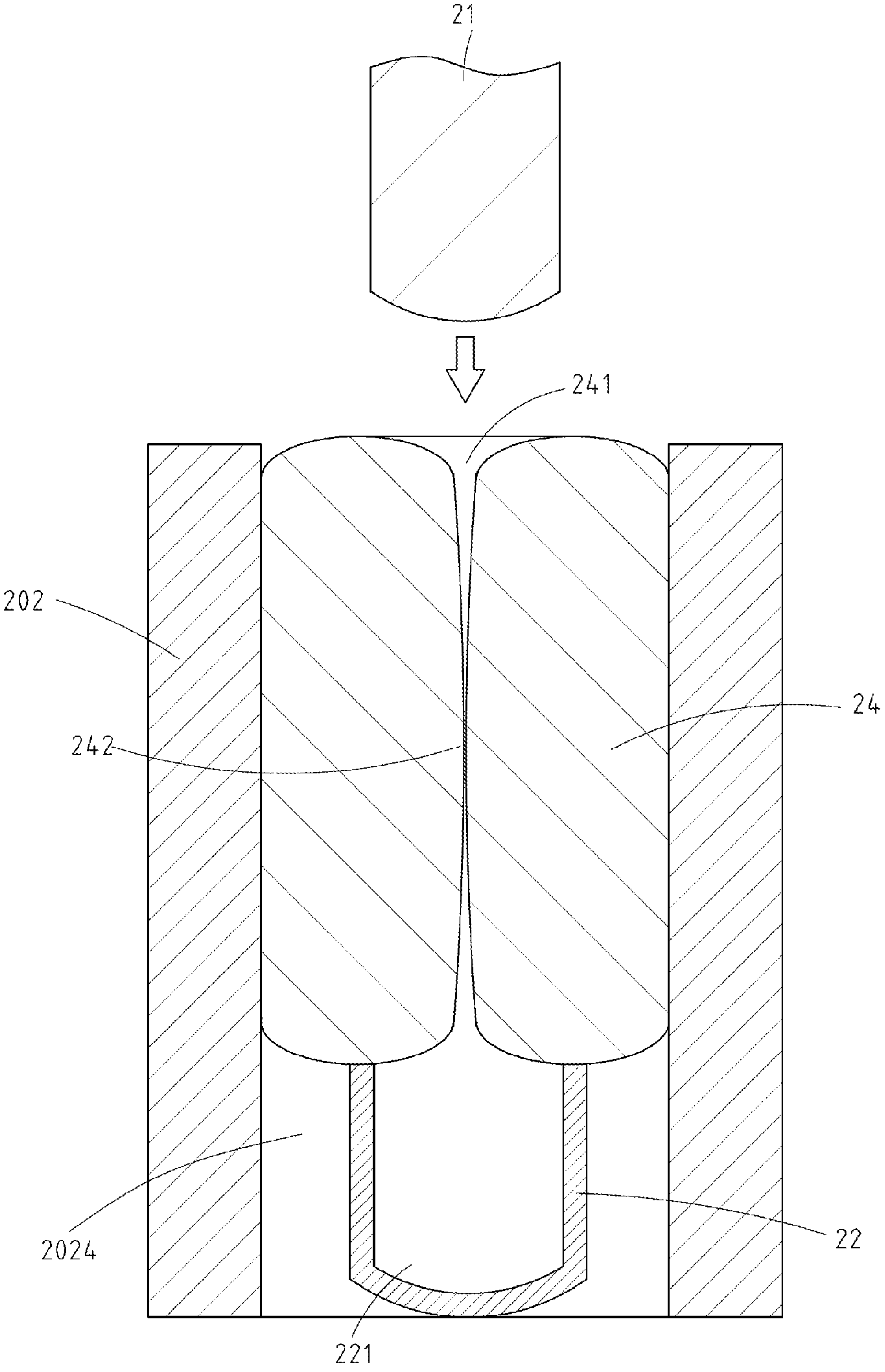
FIG. 3C is an operational schematic view illustrating a first transmitting member is to be inserted into a waterproof elastomer, according to the first embodiment of the instant disclosure.
Figure 3D:
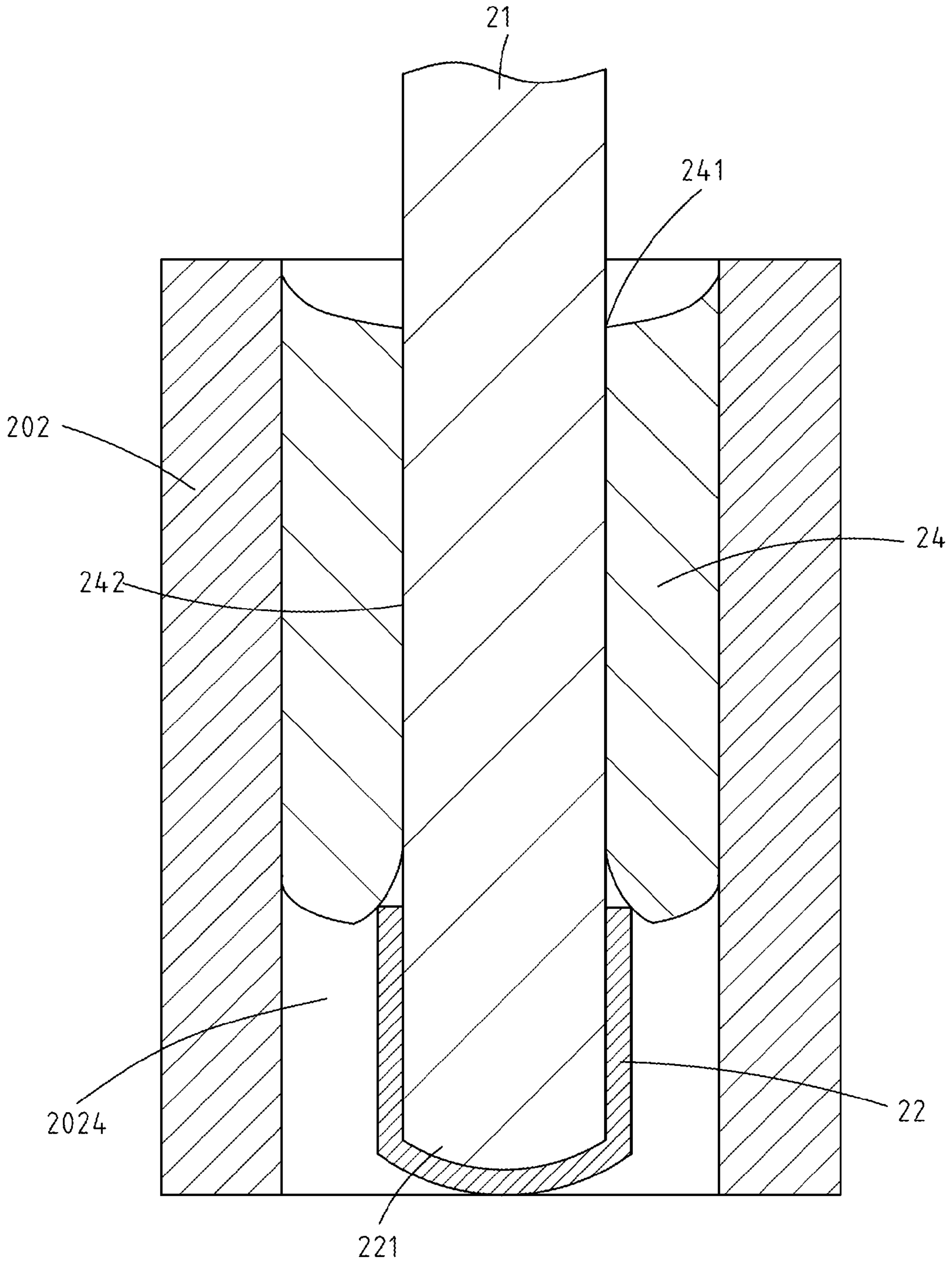
FIG. 3D is an operational schematic view illustrating the first transmitting member is inserted into the waterproof elastomer, according to the first embodiment of the instant disclosure.

Please refer to FIG. 1A to FIG. 3D, illustrating a first embodiment of a continuable waterproof cable 100. FIG. 1A and FIG. 1B illustrate perspective views of the continuable waterproof cable 100. FIG. 1C and FIG. 1D respectively illustrate top views of a continuing end 202 and a connecting end 201 of the continuable waterproof cable 100, for one variation. FIG. 2A to FIG. 2D illustrates cross-sectional views of the continuable waterproof cable 100, for several variations. FIG. 3A and FIG. 3B are schematic views illustrating two continuable waterproof cables 100 are connected with each other. FIG. 3C and FIG. 3D are operational schematic views illustrating how a first transmitting member 21 is inserted into a waterproof elastomer 24. Plural continuable waterproof cables 100 may be connected sequentially so as to transmit electrical signals, optical signals, acoustic signals, electricity signals, or network signals.

Please refer to FIG. 1A and FIG. 1B. The continuable waterproof cable 100 comprises a cable body 20, a first transmitting element 21, a first waterproof elastic member 203, a second transmitting element 22, a second waterproof elastic member 204, and a third transmitting member 23. In this embodiment, the cable body 20 is a cylinder, but embodiments are not limited thereto. The cable body 20 may be formed as other shapes. In addition, to be adapted to the environments to where the continuable waterproof cable 100 places, the cable body 20 may have high mechanical strength or flexibility. Besides, to allow the transmission of electrical signals, optical signals, acoustic signals, electricity signals, or network signals under the sea or under humid environments, the cable body 20 may be an insulator. Here, the cable body 20 may be, but not limited to, made of insulation plastics. Alternatively, the cable body 20 may be made of carbon fiber, glass fiber, or other insulation materials.

The cable body 20 has a connecting end 201 and a continuing end 202 opposite to the connecting end 201. The continuing end 202 is adapted to connect to the connecting end 201 of another continuable waterproof cable 100, and the connecting end 201 is adapted to connect to the continuing end 202 of yet another continuable waterproof cable 100, so that plural continuable waterproof cables may be connected sequentially. The first transmitting member 21 has a first end and a second end. The first end of the first transmitting member 21 is exposed out of the connecting end 201. The second transmitting member 22 is disposed at the continuing end 202 and coupled to the first transmitting member 21. Specifically, the second transmitting member 22 may be electrically connected (physically connected) or signally connected (indirectly connected) to the first transmitting member 21. The first waterproof elastic member 203 is disposed at the connecting end 201, and the second waterproof elastic member 204 is disposed at the continuing end 202. Here, the first waterproof elastic member 203 and the second waterproof elastic member 204 may be, but not limited to, made of rubber. The first waterproof elastic member 203 and the second waterproof elastic member 204 may be made of other elastic materials. Here, the second transmitting member 22 is received in a receiving space 2024 defined at the continuing end 202, and the second transmitting member 22 may be, but not limited to, coupled with the first transmitting member 21 via a wire embedded in the cable body 20. Alternatively, the second transmitting member 22 may be integrally formed at the second end of the first transmitting member 21, such that the first transmitting member 21 is coupled to the second transmitting member 22. The second transmitting member 22 is adapted to be mated with the first end of the first transmitting member 21. Therefore, as shown in FIG. 3A, when a first continuable waterproof cable 100 (the lower continuable waterproof cable 100 shown in FIG. 3A) is connected to a second continuable waterproof cable 100 (the upper continuable waterproof cable 100 shown in FIG. 3A), the second transmitting member 22 of the second continuable waterproof cable 100 is mated with the first transmitting member 21 of the first continuable waterproof cable 100. Consequently, transmission of electrical signals, optical signals, acoustic signals, electricity signals, or network signals can be achieved through the continuable waterproof cables 100 according to the instant disclosure.

The third transmitting member 23 is in the cable body 20. The third transmitting member 23 has a fixed end 231 and a free end 232. The fixed end 231 is secured at the continuing end 202. The free end 232 is detachably coupled to the first transmitting member 21, and the free end 232 is capable to be apart from the first transmitting member 21. Specifically, as shown in FIG. 3A, when the first continuable waterproof cable 100 is connected to the second continuable waterproof cable 100, the second transmitting member 22 of the second continuable waterproof cable 100 pushes the free end 232 of the first continuable waterproof cable 100 apart from the first transmitting member 21 of the first continuable waterproof cable 100 so that the free end 232 of the first continuable waterproof cable 100 is coupled to the fixed end 231 of the second continuable waterproof cable 100. Accordingly, electrical signals, acoustic signals, optical signals, electricity signals, or network signals may be transmitted between the continuable waterproof cables 100. In addition, as shown in FIG. 3A, when the first continuable waterproof cable 100 is connected to the second continuable waterproof cable 100, the first waterproof elastic member 203 of the second continuable waterproof cable 100 is attached to the connecting end 201 of the first continuable waterproof cable 100, and the second waterproof elastic member 204 of the first continuable waterproof cable 100 is attached to the continuing end 202 of the second continuable waterproof cable 100. Therefore, the continuable waterproof cables 100 can be connected to each other in a watertight manner, and moist will not penetrate inside through the junction between the continuable waterproof cables 100. In this embodiment, the first transmitting member 21, the second transmitting member 22, and the third transmitting member 23 are made with the cable body 20 via plastic injection molding techniques. That is, the aforementioned transmitting members 21, 22, 23 are arranged and disposed in a mold. Then, cable body 20 is formed with the transmitting members 21, 22, 23 by plastic injection molding, but embodiments are not limited thereto. Alternatively, the aforementioned transmitting members 21, 22, 23 may be manufactured in the cable body 20 via other techniques.

In addition, in this embodiment, the number of each set of transmitting members 21, 22, 23 is one, but embodiments are not limited thereto. Alternatively, plural first transmitting members 21, plural second transmitting members 22, and plural third transmitting members 23 may be embedded in one cable body 20. As shown in FIG. 1C and FIG. 1D, here, ten first ends of ten first transmitting members 21 are exposed out of the connecting end 201, and ten second transmitting members 22 are disposed at the continuing end 202 and respectively coupled to the ten first transmitting members 21. Twenty third transmitting members 23 are in the cable body 20, each of the third transmitting members 23 has the fixed end 231 and the free end 232. The fixed ends 231 are secured at the continuing end 202, the free ends 232 are detachably coupled to the first transmitting members 21, and the free ends 232 are capable to be apart from the first transmitting members 21. The transmitting sets (each comprises one first transmitting member 21, one second transmitting member 22, and two third transmitting members 23) are provided for transmitting the same type of signals or different types of signals. For example, the first transmitting set to the eighth transmitting set may be provided for transmitting network signals, particularly, for transmitting signals used to be transmitted by a CAT-6 cable, the ninth transmitting set may be provided for transmitting electricity signals, and the tenth transmitting set may be provided for transmitting optical signals (e.g., the tenth transmitting set may be optical fibers). Accordingly, the transmitting sets allow composite signal transmission. It is understood that the described embodiments are provided for illustrative purpose, the number of the transmitting members in each cable body 20 is not limited thereto.

In one variation, please refer to FIG. 1A, FIG. 2A, and FIG. 3A, the connecting end comprises a positioning portion 2011, and the positioning portion 2011 is defined at the center of the connecting end 201 to receive the first transmitting member 21 and the free end 232 of the third transmitting member 23. Specifically, the positioning portion 2011 may be a recess defined at the center of the connecting end 201. The continuing end 202 comprises a limiting portion 2021 and a slot 2022, the limiting portion 2021 is defined at the center of the continuing end 202, and the slot 2022 is defined at the center of the limiting portion 2021 to receive the second transmitting member 22 and the fixed end 231 of the third transmitting member 23. Specifically, the limiting portion 2021 may be a protrusion defined at the center of the continuing end 202. Accordingly, when the first continuable waterproof cable 100 is connected to the second continuable waterproof cable 100, the positioning portion 2011 of the connecting end 201 of the first continuable waterproof cable 100 is mated with the limiting portion 2021 of the continuing end 202 of the second continuable waterproof cable 100. Alternatively, in another variation, the continuing end 202 comprises a positioning portion at the center thereof to receive the second transmitting member 22 and the fixed end 231 of the third transmitting member 23. Specifically, the positioning portion may be a recess defined at the center of the continuing end 202. The connecting end 201 comprises a limiting portion and a slot, the limiting portion is at the center of the connecting end 201, and the slot is defined at the center of the limiting portion to receive the first transmitting member 21 and the free end 232 of the third transmitting member 23. Specifically, the limiting portion may be a protrusion defined at the center of the connecting end 201. Accordingly, when the first continuable waterproof cable 100 is connected to the second continuable waterproof cable 100, the limiting portion of the connecting end 201 of the first continuable waterproof cable 100 is mated with the positioning portion of the continuing end 202 of the second continuable waterproof cable 100. Consequently, plural continuable waterproof cables 100 can be connected sequentially via the positioning portions and the limiting portions.

Please refer to FIG. 1B, FIG. 2B to FIG. 2D, and FIG. 3A to FIG. 3D. The continuable waterproof cable 100 further comprises a waterproof elastomer 24 disposed at the continuing end 202. The waterproof elastomer 24 is substantially a cylindrical tubular structure and defines a channel 241 therethrough. Specifically, the waterproof elastomer 24 is placed on the second transmitting member 22 to protect the second transmitting member 22. The waterproof elastomer 24 may be, but not limited to, made of soft and elastic materials, such as rubber, foam, silica gel or latex. The inner diameter of the channel 241 is less than the outer diameter of the first end of the first transmitting member 21. In order to achieve the waterproof effect, the difference between the inner diameter of the channel 241 and the outer diameter of the first end of the first transmitting member 21 may be depended on the elasticity of the waterproof elastomer 24. In other words, when the coefficient of elasticity of the waterproof elastomer 24 is higher, the outer diameter of the first end of the first transmitting member 21 may be much greater than the inner diameter of the channel 241. On the other hand, when the coefficient of elasticity of the waterproof elastomer 24 is lower, the outer diameter of the first end of the first transmitting member 21 may be substantially equal to the inner diameter of the channel 241. An annular protrusion 242 is formed at the inner wall of the channel 241. In this embodiment, the annular protrusion 242 is substantially protruded toward the axial line of the waterproof elastomer 24 along a direction vertical to the inner wall of the channel 241, to block moist from moving from one end of the channel 241 toward the other end of the channel 241, such that the waterproof elastomer 24 itself is watertight. Please refer to FIG. 3A to FIG. 3D, when the second transmitting member 22 of the second continuable waterproof cable 100 is to be coupled to the first transmitting member 21 of the first continuable waterproof cable 100, the first transmitting member 21 of the first continuable waterproof cable 100 is inserted into the channel 241 of the waterproof elastomer 24 of the second continuable waterproof cable 100, and the periphery of the first transmitting member 21 is enclosed by the inner wall of the channel 241 of the waterproof elastomer 24, so that the first transmitting member 21 of the first continuable waterproof cable 100 is coupled to the second transmitting member 22 of the second continuable waterproof cable 100. In addition, when the first transmitting member 21 of the first continuable waterproof cable 100 is inserted into the channel 241 of the waterproof elastomer 24 of the second continuable waterproof cable 100, the annular protrusion 242 of the waterproof elastomer 24 is pressed outwardly by the first transmitting member 21 (i.e., the annular protrusion 242 of the waterproof elastomer 24 is pressed along a direction vertical to the inserting direction of the first transmitting member 21), so that the waterproof elastomer 24 is closely attached with the inner wall of the receiving space 2024 of the continuing end 202. Accordingly, moist cannot enter into the receiving space 2024 from the gap between the waterproof elastomer 24 and the receiving space 2024. In one variation, the waterproof elastomer 24 is substantially a hollow cylinder structure made of elastic materials with fluids (i.e., liquids or gases) being filled therein. Accordingly, when the first transmitting member 21 of the first continuable waterproof cable 100 is inserted into the channel 241 of the waterproof elastomer 24 of the second continuable waterproof cable 100, the middle part of an exposed end of the waterproof elastomer 24 (i.e., one end of the waterproof elastomer 24 which is far from the second transmitting member 22) is recessed inwardly due to the pressure caused by the first transmitting member 21 and the ambient pressure, while the outer periphery of the waterproof elastomer 24 is not compressed because the pressure inside the waterproof elastomer 24 is increased.

Please refer back to FIG. 1A and FIG. 2A. In this embodiment, the first transmitting member 21 is a thin rod structure, and the second transmitting member 22 is a circular groove defined a receiving room 221 therein for mating with the first transmitting member 21. In other words, the inner diameter of receiving room 221 is greater than or substantially equal to the outer diameter of the first end of the first transmitting member 21. Based on this, the second transmitting member 22 of the second continuable waterproof cable 100 is smoothly connected to the first transmitting member 21 of the first continuable waterproof cable 100. The fixed end 231 of the third transmitting member 23 is a ring structure disposed around the outer periphery of the second transmitting member 22. That is, the second transmitting member 22 and the fixed end 231 of the third transmitting member 23 are substantially disposed concentrically. The third transmitting member 23 may be, but not limited to, made of conductive materials, such as metal, conductive rubber, conductive polymer, etc. The free end 232 of the third transmitting member 23 is a flexible stripe structure, so that the free end 232 of the third transmitting member 23 is movably leant against the first transmitting member 21. Here, the number of the third transmitting member 23 may be, but not limited to, two, and the two free ends 232 of the two third transmitting members 23 are respectively leant against the two sides of the first transmitting member 21.

Specifically, when the continuable waterproof cable 100 is provided for transmitting optical signals, the first transmitting member 21 may be, but not limited to, an optical fiber, and the second transmitting member 22 may be, but not limited to, a ceramic socket adapted to couple with the optical fiber, respectively, and the free end 232 and the fixed end 231 of the third transmitting member 23 are provided for guiding the ceramic socket to couple with the optical fiber. In addition, due to the waterproof feature, the continuable waterproof cable 100 may be applied for performing stable signal transmission or electricity transmission in transportations (e.g., like vehicle, ships, etc.) or in certain places (e.g., tunnel, oil well, etc.).

Please refer to FIG. 1B, FIG. 2B, FIG. 2C and FIG. 2D. For the sake of convenience in assembling and disassembling plural continuable waterproof cables 100, the continuable waterproof cable 100 further comprises a first socket 25 and a second socket 26. The first socket 25 is fitted over the outer periphery of the connecting end 201, and the second socket 26 is fitted over the outer periphery of the continuing end 202. Wherein, the inner diameter of the first socket 25 is substantially equal to or less than the outer diameter of the second socket 26. Accordingly, when the connecting end 201 of the first continuable waterproof cable 100 is connected to the continuing end 202 of the second continuable waterproof cable 100, the second socket 26 of the second continuable waterproof cable 100 is mated with the first socket 25 of the first continuable waterproof cable 100. In some implementation aspects, in order to allow plural continuable waterproof cables 100 securely connected in sequence, the first socket 25 further comprises a first securing portion 251 defined around the inner wall thereof, the second socket 26 further comprises a second securing portion 261 defined around the outer wall thereof, and the first securing portion 251 is adapted to be mated with the second securing portion 261. Here, the first securing portion 251 may be, but not limited to, an inner thread structure, while the second securing portion 261 may be, but not limited to, an outer thread structure. Alternatively, the first and second securing portions 251, 261 may be combined with each other by means of mating, packing, engaging, etc. Accordingly, an operator may firmly connect plural continuable waterproof cables 100 sequentially. In some implementations, a securing structure is defined around the outer periphery of the cable body 20 and provided for secure adjacent two continuable waterproof cables 100. The securing structure may be provided to secure adjacent two continuable waterproof cables 100 by means of locking, engaging, etc.

Please refer to FIG. 2B and FIG. 2C. In some implementations, at least one of the first socket 25 and the second socket 26 is rotatably fitted over the cable body 20. Here, both the first socket 25 and the second socket 26 are rotatable relative to the cable body 20, but embodiments are not limited thereto. Specifically, a first limiting groove 2015 is defined around the outer periphery of the connecting end 201 to mate with the first socket 25, so that the first socket 25 is engaged in the first limiting groove 2015 and is rotatable relative to the cable body 20. In other words, the first socket 25 and the first limiting groove 2015 are configured to make the first socket 25 rotatable along the first limiting groove 2015. Similarly, a second limiting groove 2026 is defined around the outer periphery of the continuing end 202 to mate with the second socket 26, so that the second socket 26 is engaged in the second limiting groove 2026 and is rotatable relative to the cable body 20. In other words, the second socket 26 and the second limiting groove 2026 are configured to make the second socket 26 rotatable along the second limiting groove 2026. Additionally, for the sake of convenience in assembling and disassembling plural continuable waterproof cables 100, the first socket 25 has first holding portions 252 protruded thereon, and the second socket 26 has second holding portions 262 protruded thereon. For example, the first holding portions 252 may be, but not limited to, claws annularly protruded from the outer periphery of the first socket 25. Likewise, the second holding portions 262 may be, but not limited to, claws annularly protruded from the outer periphery of the second socket 26. Accordingly, an operator may rotate, by holding the first and second holding portions 252, 262, the first socket 25 of the first continuable waterproof cable 100 relative to the second socket 26 of the second continuable waterproof cable 100 to allow the first socket 25 of the first continuable waterproof cable 100 to combine to or to detach from the second socket 26 of the second continuable waterproof cable 100. Accordingly, the operator may assemble or disassemble plural continuable waterproof cables 100 without rotating the cable bodies 20.

Please refer to FIG. 2D. In some implementations, at least one of the first socket 25 and the second socket 26 is fixedly fitted over the cable body 20. In FIG. 2D, both the first socket 25 and the second socket 26 are fixed fitted over the cable body 20. Here, the first socket 25 may be, but not limited to, integrally formed on the outer periphery of the connecting end 201. Likewise, the second socket 26, may be, but not limited to, integrally formed on the outer periphery of the continuing end 202. Alternatively, the first socket 25 or the second socket 26 may be firmly combined to the cable body 20.

Please refer to FIG. 1B, FIG. 2B, FIG. 2C, FIG. 3A, and FIG. 3B. To provide a better watertight performance, the continuable waterproof cable 100 further comprises a first elastic pad 253 and a second elastic pad 263. Please refer to FIG. 2B and FIG. 3A. The first elastic pad 253 may be, but not limited to, disposed at the inner wall of the first socket 25, and the second elastic pad 263 may be, but not limited to, disposed at the outer wall of the second socket 26. Accordingly, when the first continuable waterproof cable 100 is connected to the second continuable waterproof cable 100, the first elastic pad 253 of the first continuable waterproof cable 100 is abutted against the second socket 26 of the second continuable waterproof cable 100, and the second elastic pad 263 of the second continuable waterproof cable 100 is abutted against the first socket 25 of the first continuable waterproof cable 100, as shown in FIG. 3A. Here, the first elastic pad 253 and the second elastic pad 263 may be, but not limited to, rubber washers respectively and detachably fitted over the first socket 25 and the second socket 26. Alternatively, the first elastic pad 253 and the second elastic pad 263 may be directly secured on the first socket 25 and the second socket 26, respectively. Accordingly, the watertight performance can be further improved due to the first elastic pad 253 and the second elastic pad 263.

A variation of the first elastic pad 253 and the second elastic pad 263 is described as below. Please refer to FIG. 2C and FIG. 2D. The first elastic pad 253 is received in the first limiting groove 2015. One of two sides of the first elastic pad 253 is abutted against the first socket 25, and the other side of the first elastic pad 253 is abutted against the inner wall of the first limiting groove 2015. Similarly, the second elastic pad 263 is received in the second limiting groove 2026. One of two sides of the second elastic pad 263 is abutted against the second socket 26, and the other side of the second elastic pad 263 is abutted against the inner wall of the second limiting groove 2026. Please refer to FIG. 3B. When the first continuable waterproof cable 100 is connected to the second continuable waterproof cable 100, the first elastic pad 253 is abutted against the first socket 25 and the inner wall of the first limiting groove 2015, and the second elastic pad 263 is abutted against the second socket 26 and the inner wall of the second limiting groove 2026. Therefore, the two continuable waterproof cables 100 are press-fitted with each other to provide better watertight performance.

Please refer to FIG. 1B, FIG. 2B to FIG. 2D, and FIG. 3A to FIG. 3B. A flexible compressible member 27 is fitted over the fixed end 231 of the third transmitting member 23 at the continuing end 202. The flexible compressible member 27 is tubular shaped, and the structure of the flexible compressible member 27 is substantially similar to a blast pipe or a shock absorber, and the flexible compressible member 27 can be folded and telescoped. When the second continuable waterproof cable 100 is not connected to the first continuable waterproof cable 100, the flexible compressible member 27 encloses the outer periphery of the fixed end 231 of the third transmitting 23 to prevent moist from being in contact with the fixed end 231. On the other hand, when the continuing end 202 of the second continuable waterproof cable 100 is connected to the connecting end 201 of the first continuable waterproof cable 100, as shown in FIG. 3A and FIG. 3B, the flexible compressible member 27 of the second continuable waterproof cable 100 is compressed inward by the free end 232 of the first continuable waterproof cable 100, so that the fixed end 231 of the second continuable waterproof cable 100 is exposed out of the flexible compressible member 27 and the fixed end 231 of the second continuable waterproof cable 100 is then coupled to the free end 232 of the first continuable waterproof cable 100. Conversely, when the continuing end 202 of the second continuable waterproof cable 100 is detached from the connecting end 201 of the first continuable waterproof cable 100, the flexible compressible member 27 of the second continuable waterproof cable 100 is reinstatement, due to the flexibility.

In addition, please refer to FIG. 1B, FIG. 2B to FIG. 2D, and FIG. 3A to FIG. 3D, to prevent the second transmitting member 22 from being in contact with the fixed end 231 of the third transmitting member 23 and leads short circuit issue during signal transmission, an insulating member 28 is arranged between the second transmitting member 22 and the fixed end 231 of the third transmitting member 23 to separate the second transmitting member 22 from the fixed end 231. The insulating member 28 may be, but not limited to, made of rubber materials. Optionally, the insulating member 28 may be carried out by forming hard plastics between the second transmitting member 22 and the fixed end 231 of the third transmitting member 23. In one variation, the insulating member 28 may be integrally formed on the cable body 20, for example, via proper injection molding techniques.

Figure 4:
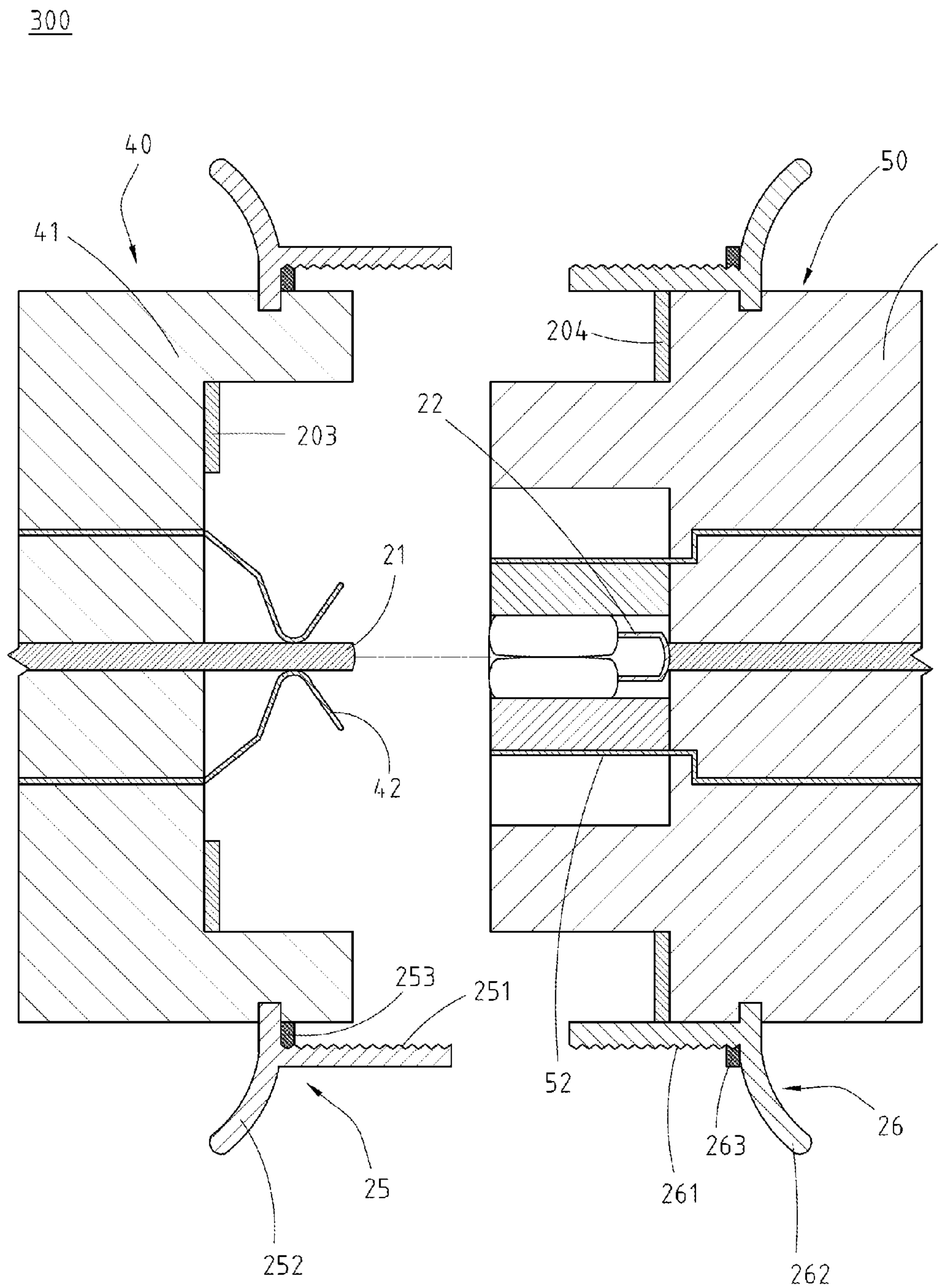
FIG. 4 illustrates a cross-sectional view of a second embodiment of a waterproof terminal assembly according to the instant disclosure.
Figure 5:
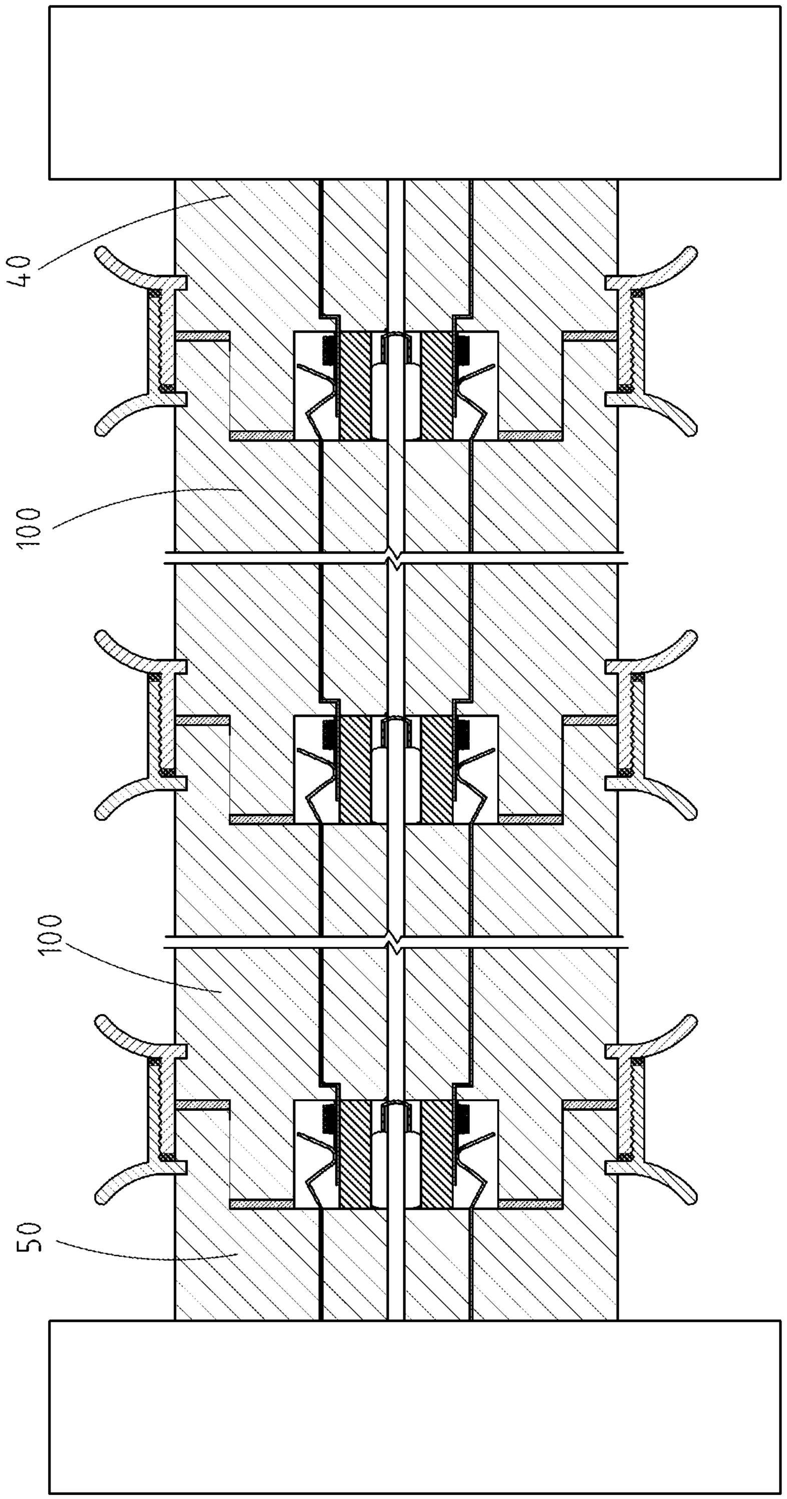
FIG. 5 illustrates an operational schematic view of the second embodiment of the waterproof terminal assembly according to the instant disclosure.

Please refer to FIG. 4 and FIG. 5, illustrating a second embodiment of a waterproof terminal assembly 300 according to the instant disclosure. FIG. 4 illustrates a cross-sectional view of the waterproof terminal assembly 300, and FIG. 5 illustrates an operational schematic view of the waterproof terminal assembly 300. The waterproof terminal assembly 300 comprises a male terminal 40 and a female terminal 50.

The male terminal 40 comprises a male terminal body 41, a first waterproof elastic member 203, a first transmitting member 21 and a free transmitting member 42. The first waterproof elastic member 203 is disposed at an end portion of the male terminal body 41. The first transmitting member 21 is disposed at the end portion of the male terminal body 41. The free transmitting member 42 is detachably coupled to the first transmitting member 21. Specifically, the free transmitting member 42 may be electrically connected (physically connected) or signally connected (indirectly connected) to the first transmitting member 21.

The female terminal 50 comprises a female terminal body 51, a second waterproof elastic member 204, a second transmitting member 22 and a fixed transmitting member 52. The second waterproof elastic member 204 is disposed at an end portion of the female terminal body 51. The second transmitting member 22 is disposed at the end portion of the female terminal body 51, and the second transmitting member 22 is adapted to be mated with the first transmitting member 21, so that the second transmitting member 22 is coupled to the first transmitting member 21. The fixed transmitting member 52 is disposed at the second transmitting member 22 and spaced from the second transmitting member 22. When the male terminal 40 is connected to the female terminal 50, the first transmitting member 21 is connected to the second transmitting member 22, and the second transmitting member 22 pushes the free transmitting member 42 apart from the first transmitting member 21 so that the free transmitting member 42 is coupled to the fixed transmitting member 52. Based on this, the first waterproof elastic member 203 is attached to the end portion of the female terminal body 51, and the second waterproof elastic member 204 is attached to the male terminal body 41.

In one implementation aspect, the waterproof terminal assembly 300 further comprises a waterproof elastomer 24 disposed at the end portion of the female terminal body 51. The waterproof elastomer 24 is substantially a cylindrical tubular structure and defines a channel 241 therethrough. Specifically, the waterproof elastomer 24 is placed on the second transmitting member 22 to protect the second transmitting member 22. The waterproof elastomer 24 may be, but not limited to, made of soft and elastic materials, such as rubber, foam, silica gel or latex. The inner diameter of the channel 241 is less than the outer diameter of the first transmitting member 21. In order to achieve the waterproof effect, the difference between the inner diameter of the channel 241 and the outer diameter of the first transmitting member 21 may be depended on the elasticity of the waterproof elastomer 24. In other words, when the coefficient of elasticity of the waterproof elastomer 24 is higher, the outer diameter of the first transmitting member 21 may be much greater than the inner diameter of the channel 241. On the other hand, when the coefficient of elasticity of the waterproof elastomer 24 is lower, the outer diameter of the first transmitting member 21 may be substantially equal to the inner diameter of the channel 241. An annular protrusion 242 is formed at the inner wall of the channel 241. In this embodiment, the annular protrusion 242 is substantially protruded toward the axial line of the waterproof elastomer 24 along a direction vertical to the inner wall of the channel 241, to block moist from moving from one end of the channel 241 toward the other end of the channel 241, such that the waterproof elastomer 24 itself is watertight. Please refer to FIG. 4, when the male terminal 40 is to be coupled to the female terminal 50, the first transmitting member 21 of the male terminal 40 is inserted into the channel 241 of the waterproof elastomer 24 of the female terminal 50, and the periphery of the first transmitting member 21 is enclosed by the inner wall of the channel 241 of the waterproof elastomer 24, so that the first transmitting member 21 of the male terminal 40 is coupled to the second transmitting member 22 of the female terminal 50.

In one implementation aspect, the waterproof terminal assembly 300 further comprises a first socket 25 and a second socket 26, as shown in FIG. 4. The first socket 25 is fitted over the outer periphery of the male terminal body 41, the second socket 26 is fitted over the outer periphery of the female terminal body 51, and the inner diameter of the first socket 25 is substantially equal to the outer diameter of the second socket 26. In one variation, the first socket 25 further comprises a first securing portion 251 defined around the inner wall thereof, the second socket 26 further comprises a second securing portion 261 defined around the outer wall thereof, and the first securing portion 251 is adapted to be mated with the second securing portion 261. Here, the first securing portion 251 may be, but not limited to, an outer thread structure, while the second securing portion 261 may be, but not limited to an outer thread structure. Alternatively, the first and second securing portions 251, 261 may be combined with each other by engaging means.

In some implementation aspects, the first socket 25 is fixedly fitted over the male terminal body 41 or the second socket 26 is fixedly fitted over the female terminal body 51, but embodiments are not limited thereto.

In some implementation aspects, at least one of the male terminal body 41 and the female terminal body 51 defines a limiting groove around the outer periphery thereof, and at least one of the first socket 25 and the second socket 26 is engaged in the limiting groove so as to rotate relative to the male terminal body 41 or to rotate relative to the female terminal body 51. Please refer to FIG. 4 and FIG. 5, in which the first socket 25 is rotatable relative to the male terminal body 41 and the second socket 26 is rotatable relative to the female terminal body 51. Here, a first limiting groove 2015 is defined around the outer periphery of the male terminal body 41, so that the first socket 25 is engaged in the first limiting groove 2015 and is rotatable relative to the male terminal body 41. In other words, the first socket 25 and the first limiting groove 2015 are configured to make the first socket 25 rotatable along the first limiting groove 2015. Likewise, a second limiting groove 2026 is defined around the outer periphery of the female terminal body 51, so that the second socket 26 is engaged in the second limiting groove 2026 and is rotatable relative to the female terminal body 51. In other words, the second socket 26 and the second limiting groove 2026 are configured to make the second socket 26 rotatable along the second limiting groove 2026. Additionally, for the sake of convenience in assembling and disassembling the waterproof terminal assembly

300, the first socket 25 has first holding portions 252 protruded thereon, and the second socket 26 has second holding portions 262 protruded thereon. For example, the first holding portions 252 may be, but not limited to, claws annularly protruded from the outer periphery of the first socket 25. Likewise, the second holding portions 262 may be, but not limited to, claws annularly protruded from the outer periphery of the second socket 26. Accordingly, an operator may rotate, by holding the first holding portions 252 and the second holding portions 262, the first socket 25 of the male terminal 40 relative to the second socket 26 of the female terminal 50 to allow the first socket 25 to combine to or to detach from the second socket 26.

To provide a better watertight performance, the waterproof terminal assembly 300 further comprises a first elastic pad 253 and a second elastic pad 263. Please refer to FIG. 4 and FIG. 5. The first elastic pad 253 is disposed at the inner wall of the first socket 25, and the second elastic pad 263 is disposed at the outer wall of the second socket 26. Accordingly, when the female terminal 50 is connected to the male terminal 40, the first elastic pad 253 of the male terminal 40 is abutted against the second socket 26 of the female terminal 50, and the second elastic pad 263 of the female terminal 50 is abutted against the first socket 25 of the male terminal 40. Accordingly, the watertight performance can be further improved due to the first elastic pad 253 and the second elastic pad 263.

A variation of the first elastic pad 253 and the second elastic pad 263 is described as below. The first elastic pad 253 is received in the first limiting groove 2015. Specifically, one of two sides of the first elastic pad 253 is abutted against the first socket 25, and the other side of the first elastic pad 253 is abutted against the inner wall of the first limiting groove 2015. Similarly, the second elastic pad 263 is received in the second limiting groove 2026. Specifically, one of two sides of the second elastic pad 263 is abutted against the second socket 26, and the other side of the second elastic pad 263 is abutted against the inner wall of the second limiting groove 2026.

Please refer to FIG. 5. For example, when network signals, electricity signals are to be transmitted from a supplying station to a receiving station through plural connected continuable waterproof cables 100, in which the supplying station is located at a first country, the receiving station is located at a second country, and the continuable waterproof cables 100 are in the ocean, the supplying station would have a supplying terminal adapted to be mated with the connecting end 201 of the continuable waterproof cable 100, and the receiving station would have a receiving terminal adapted to be mated with the continuing end 202 of the continuable waterproof cable 100. That is, the female terminal 50 is the supplying terminal, the outline of the female terminal 50 is similar to the continuing end 202 of the continuable waterproof cable 100, and the female terminal 50 is adapted to be coupled to the connecting end 201 of the continuable waterproof cable 100. Likewise, the male terminal 40 is the receiving terminal, the outline of the male terminal 40 is similar to the connecting end 201 of the continuable waterproof cable 100, and the male terminal 40 is adapted to be coupled to the continuing end 202 of the continuable waterproof cable 100. Accordingly, plural continuable waterproof cables 100 can be connected in sequence and eventually coupled to the supplying terminal and the receiving terminal, so that electrical signals, optical signals, acoustic signals, network signals, or electricity signals can be transmitted from the supplying terminal to the receiving terminal, in a long distance manner.

If the supplying station provides direct current to the receiving station, the first end of the first transmitting member 21 and the fixed end 231 of the third transmitting member 23 correspond to the negative electrode, and the second transmitting member 22 and the free end 232 of the third transmitting member 23 correspond to the positive electrode. Conversely, if the supplying station provides alternating current to the receiving station, the first end of the first transmitting member 21 and the fixed end 231 of the third transmitting member 23 correspond to the ground, and the second transmitting member 22 and the free end 232 of the third transmitting member 23 correspond to the hotwire.

Figure 6:
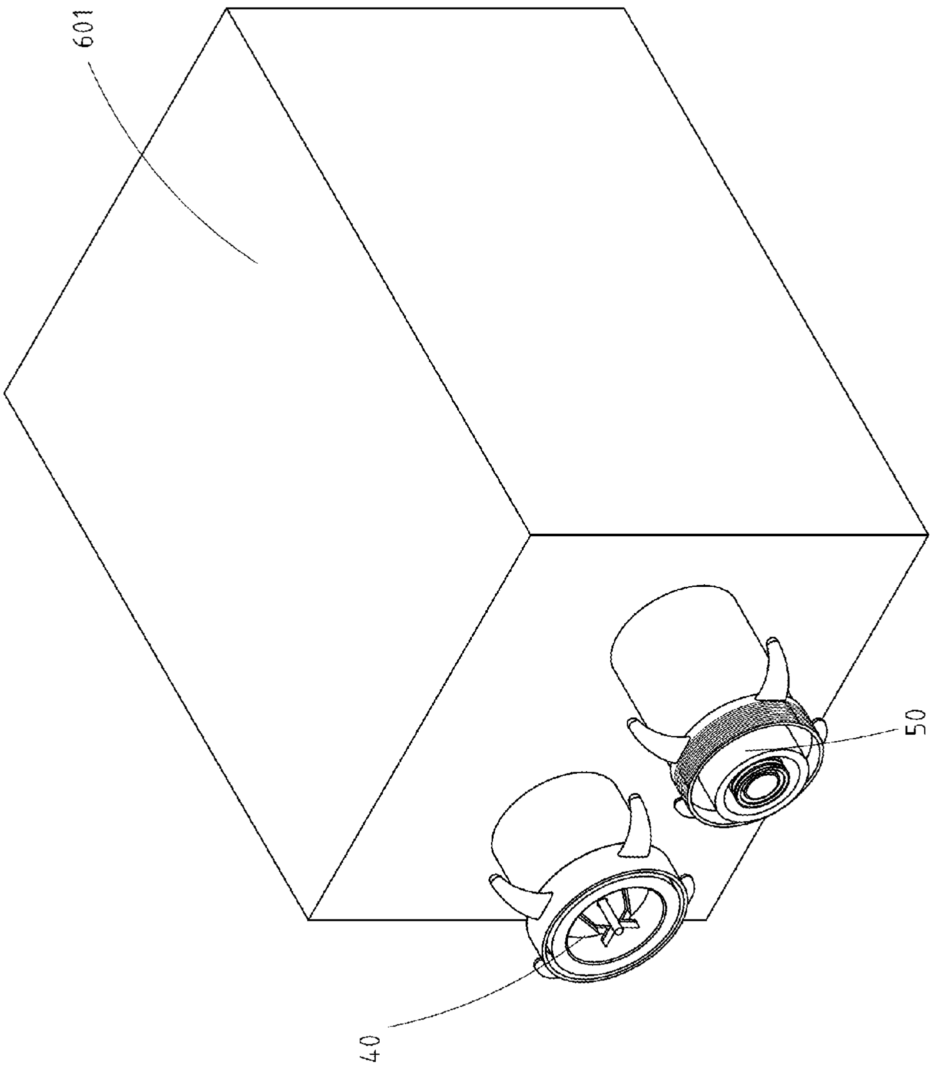
FIG. 6 illustrates a perspective view of a third embodiment of a continuable waterproof power module according to the instant disclosure.
Figure 7:
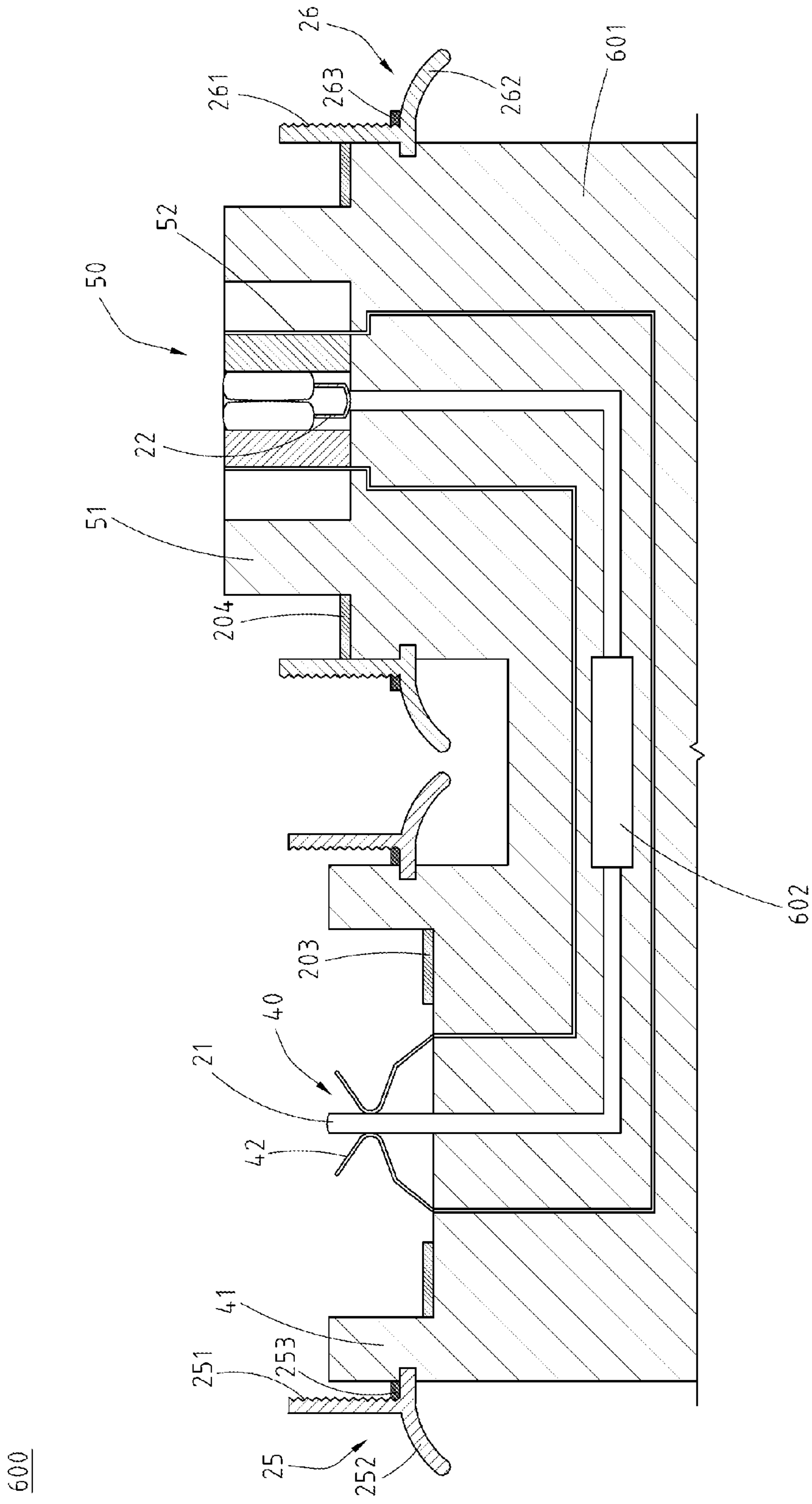
FIG. 7 illustrates a cross-sectional view of the third embodiment of the continuable waterproof power module according to the instant disclosure.
Figure 8:
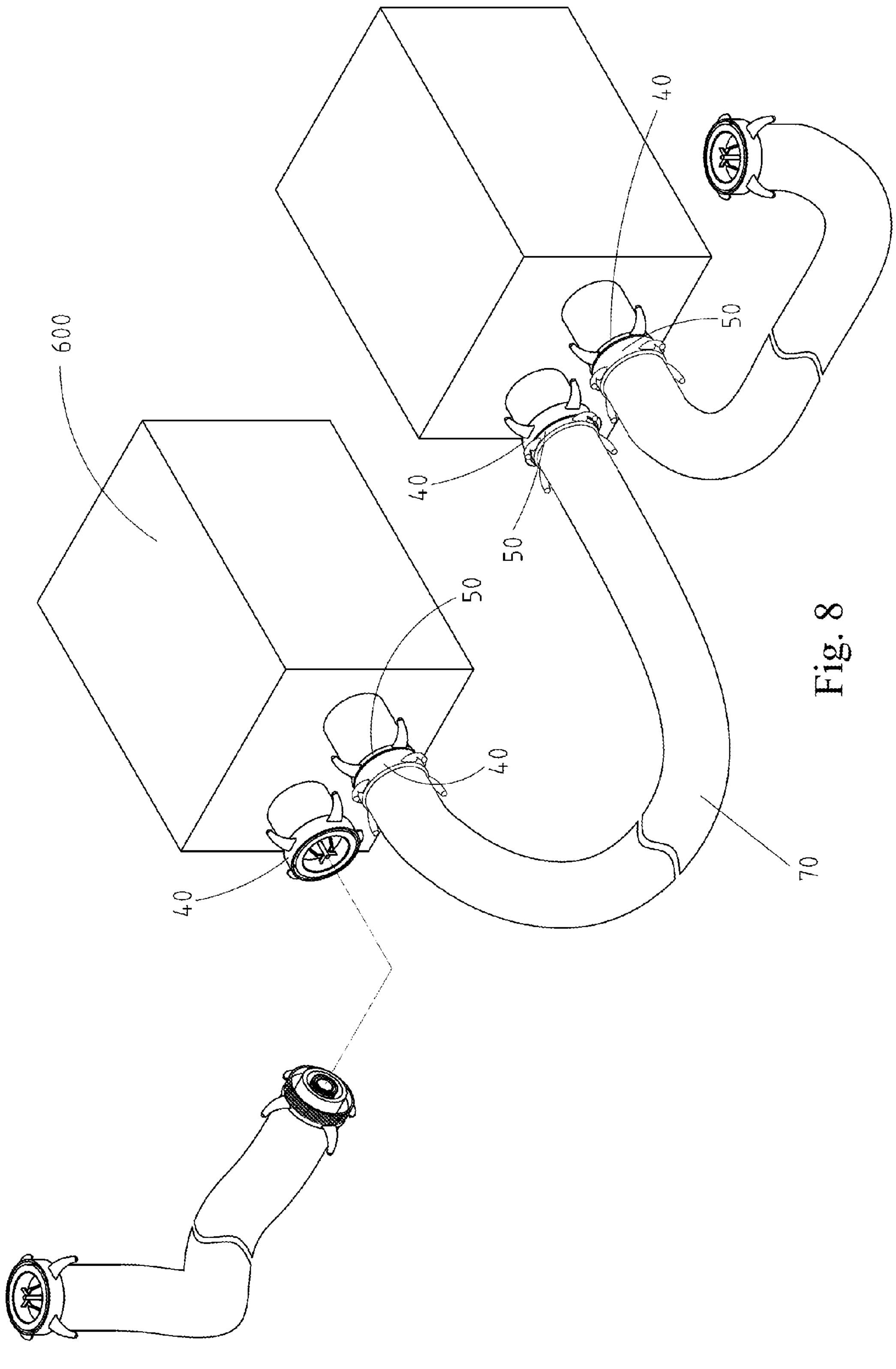
FIG. 8 illustrates an operational schematic view of the third embodiment of the continuable waterproof power module according to the instant disclosure.

Please refer to FIG. 6, FIG. 7, and FIG. 8, illustrating a third embodiment of a continuable waterproof power module 600 according to the instant disclosure. FIG. 6 illustrates a perspective view of the continuable waterproof power module 600 according to the instant disclosure, FIG. 7 illustrates a cross-sectional view of the continuable waterproof power module 600 according to the instant disclosure, and FIG. 8 illustrates an operational schematic view of the continuable waterproof power module 600. The continuable waterproof power module 600 comprises a housing 601, a battery core 602, a male terminal 40, and a female terminal 50.

Please refer to FIG. 6 and FIG. 7. The battery core 602 is received in the housing 601. The male terminal 40 is disposed at a first side of the housing 601, the female terminal 50 is disposed at the first side or a second side of the housing 601, and the second side is not opposite to the first side. As illustrated in FIG. 6 to FIG. 8, here, the male terminal 40 and the female terminal 50 are both disposed at the first side of the housing 601. The male terminal 40 and the female terminal 50 are electrically connected to the battery core 602. Here, the housing 601 is rectangular shaped, but embodiments are not limited thereto.

The male terminal 40 comprises a male terminal body 41, a first waterproof elastic member 203, a first socket 25, a first securing portion 251, a first transmitting member 21, and a free transmitting member 42. The first waterproof elastic member 203 is disposed at an end portion of the male terminal body 41. The first socket 25 is fitted over the outer periphery of the male terminal body 41, and the first securing portion 251 is defined around the inner wall of the first socket 25. Here, the first securing portion 251 is an inner thread structure. The first transmitting member 21 is disposed at the end portion of the male terminal body 41. The free transmitting member 42 is disposed at the end portion of the male terminal body 41 and detachably coupled to the first transmitting member 21. The female terminal 50 comprises a female terminal body 51, a second waterproof elastic member 204, a second socket 26, a second securing portion 261, a second transmitting member 22, and a fixed transmitting member 52. The second waterproof elastic member 204 is disposed at an end portion of the female terminal body 51. The second socket 26 is fitted over the outer periphery of the female terminal body 51, and the inner diameter of the first socket 25 is substantially equal to the outer diameter of the second socket 26. The second securing portion 261 is defined around the outer wall of the second socket 26. Here, the second securing portion 261 is an outer thread structure. In other words, the second securing portion 261 is adapted to be mated with the first securing portion 251. Alternatively, the first and second securing portions 251, 252 may be mated with each other by engaging means. The second transmitting member 22 is disposed at the end portion of the female terminal body 51, and the second transmitting member 22 is adapted to be coupled with the first transmitting member 21. The fixed transmitting member 52 is disposed at the end portion of the female terminal body 51 and spaced from the second transmitting member 22.

Please refer to FIG. 8. Plural continuable waterproof power modules 600 may be connected by wires 70. Specifically, a first terminal of the wire 70 is adapted to mate with the male terminal 40, and a second terminal of the wire 70 is adapted to mate with the female terminal 50, so that plural continuable waterproof power modules 600 may be coupled by the wires 70. Accordingly, one of the male terminals 40 of the plural continuable waterproof power modules 600 is coupled to an electronic device to supply electricity to the electronic device.

In one implementation aspect, the continuable waterproof power module 600 further comprises a waterproof elastomer 24 disposed at the end portion of the female terminal body 51. The waterproof elastomer 24 is substantially a cylindrical tubular structure and defines a channel 241 therethrough. Specifically, the waterproof elastomer 24 is placed on the second transmitting member 22 to protect the second transmitting member 22. The waterproof elastomer 24 may be, but not limited to, made of soft and elastic materials, such as rubber, foam, silica gel or latex. The inner diameter of the channel 241 is less than the outer diameter of the first transmitting member 21. In order to achieve the waterproof effect, the difference between the inner diameter of the channel 241 and the outer diameter of the first transmitting member 21 may be depended on the elasticity of the waterproof elastomer 24. In other words, when the coefficient of elasticity of the waterproof elastomer 24 is higher, the outer diameter of the first transmitting member 21 may be much greater than the inner diameter of the channel 241. On the other hand, when the coefficient of elasticity of the waterproof elastomer 24 is lower, the outer diameter of the first transmitting member 21 may be substantially equal to the inner diameter of the channel 241. An annular protrusion 242 is formed at the inner wall of the channel 241. In this embodiment, the annular protrusion 242 is substantially protruded toward the axial line of the waterproof elastomer 24 along a direction vertical to the inner wall of the channel 241, to block moist from moving from one end of the channel 241 toward the other end of the channel 241, such that the waterproof elastomer 24 itself is watertight. Please refer to FIG. 4, when the male terminal 40 is to be coupled to the female terminal 50, the first transmitting member 21 of the male terminal 40 is inserted into the channel 241 of the waterproof elastomer 24 of the female terminal 50, and the periphery of the first transmitting member 21 is enclosed by the inner wall of the channel 241 of the waterproof elastomer 24, so that the first transmitting member 21 of the male terminal 40 is coupled to the second transmitting member 22 of the female terminal 50.

In some implementation aspects, the first socket 25 is fixedly fitted over the male terminal body 41 or the second socket 26 is fixedly fitted over the female terminal body 51, but embodiments are not limited thereto.

In some implementation aspects, at least one of the male terminal body 41 and the female terminal body 51 defines a limiting groove around the outer periphery thereof, and at least one of the first socket 25 and the second socket 26 is engaged in the limiting groove so as to rotate relative to the male terminal body 41 or to rotate relative to the female terminal body 51. Please refer to FIG. 7 and FIG. 8, in which the first socket 25 is rotatable relative to the male terminal body 41 and the second socket 26 is rotatable relative to the female terminal body 51. Here, a first limiting groove 2015 is defined around the outer periphery of the male terminal body 41, so that the first socket 25 is engaged in the first limiting groove 2015 and is rotatable relative to the male terminal body 41. Likewise, a second limiting groove 2026 is defined around the outer periphery of the female terminal body 51, so that the second socket 26 is engaged in the second limiting groove 2026 and is rotatable relative to the female terminal body 51.

To provide a better watertight performance, the continuable waterproof power module 600 further comprises a first elastic pad 253 and a second elastic pad 263. Please refer to FIG. 7 and FIG. 8. The first elastic pad 253 is disposed at the inner wall of the first socket 25, and the second elastic pad 263 is disposed at the outer wall of the second socket 26. Accordingly, when the female terminal 50 or the male terminal 40 of the continuable waterproof power module 600 is connected to the wire 70, the first elastic pad 253 of the male terminal 40 is abutted against the second socket 26 of the wire 70, and the second elastic pad 263 of the female terminal 50 is abutted against the first socket 25 of the wire 70. Accordingly, the watertight performance between the continuable waterproof power module 600 and the wire 70 can be further improved due to the first elastic pad 253 and the second elastic pad 263.

A variation of the first elastic pad 253 and the second elastic pad 263 is described as below. The first elastic pad 253 is received in the first limiting groove 2015. Specifically, one of two sides of the first elastic pad 253 is abutted against the first socket 25, and the other side of the first elastic pad 253 is abutted against the inner wall of the first limiting groove 2015. Similarly, the second elastic pad 263 is received in the second limiting groove 2026. Specifically, one of two sides of the second elastic pad 263 is abutted against the second socket 26, and the other side of the second elastic pad 263 is abutted against the inner wall of the second limiting groove 2026.

Based on the above, the workload, the cost, and the time for assembling and repairing the submarine cables can be reduced due to the waterproof feature provided by the continuable waterproof cable according to the instant disclosure. In addition, the waterproof terminal assembly can be adopted to couple with the continuable waterproof cable or the continuable waterproof power module. Accordingly, transmission of electrical signals, optical signals, acoustic signals, electricity signals, or network signals can be achieved, by connecting the continuable waterproof cable in sequence, according to the instant disclosure.

While the instant disclosure has been described by way of example and in terms of the preferred embodiments, it is to be understood that the invention needs not be limited to the disclosed embodiments. For anyone skilled in the art, various modifications and improvements within the spirit of the instant disclosure are covered under the scope of the instant disclosure. The covered scope of the instant disclosure is based on the appended claims.

What is claimed is:

1. A waterproof terminal assembly, comprising:

a male terminal, comprising:

a male terminal body;

a first waterproof elastic member, disposed at an end portion of the male terminal body;

a first transmitting member, disposed at the end portion of the male terminal body; and a free transmitting member, detachably coupled to the first transmitting member; and a female terminal, comprising:

a female terminal body;

a second waterproof elastic member, disposed at an end portion of the female terminal body;

a second transmitting member, disposed at the end portion of the female terminal body, wherein the second transmitting member is adapted to the first transmitting member, so that the second transmitting member is coupled to the first transmitting member; and a fixed transmitting member, disposed at the end portion of the female terminal body and spaced from the second transmitting member;

wherein, when the male terminal is connected to the female terminal, the first transmitting member is connected to the second transmitting member, and the second transmitting member pushes the free transmitting member apart from the first transmitting member so that the free transmitting member is coupled to the fixed transmitting member, the first waterproof elastic member is attached to the end portion of the female terminal body, and the second waterproof elastic member is attached to the male terminal body.

2. The waterproof terminal assembly according to claim 1, further comprising a waterproof elastomer at the end portion of the female terminal body and placed on the second transmitting member, wherein the waterproof elastomer defines a channel therethrough, the inner diameter of the channel is less than the outer diameter of the male transmitting member, wherein when the male terminal is connected to the female terminal, the first transmitting member is inserted into the channel of the waterproof elastomer, and the periphery of the first transmitting member is enclosed by the inner wall of the channel of the waterproof elastomer.

3. The waterproof terminal assembly according to claim 1, further comprising a first socket and a second socket, wherein the first socket is fitted over the outer periphery of the male terminal body, the second socket is fitted over the outer periphery of the female terminal body, and wherein the inner diameter of the first socket is substantially equal to the outer diameter of the second socket.

4. The waterproof terminal assembly according to claim 3, wherein the first socket further comprises a first securing portion defined around the inner wall thereof, the second socket further comprises a second securing portion defined around the outer wall thereof, and the first securing portion is adapted to the second securing portion.

5. The waterproof terminal assembly according to claim 3, further comprising a first elastic pad and a second elastic pad, wherein the first elastic pad is disposed at the inner wall of the first socket, the second elastic pad is disposed at the outer wall of the second socket, wherein when the male terminal is connected to the female terminal, the first elastic pad is abutted against the second socket, and the second elastic pad is abutted against the first socket.

6. The waterproof terminal assembly according to claim 3, wherein the first socket is fixedly fitted over the male terminal body or the second socket is fixedly fitted over the female terminal body.

7. The waterproof terminal assembly according to claim 3, wherein at least one of the male terminal body and the female terminal body defines a limiting groove around the outer periphery thereof, at least one of the first socket and the second socket is engaged in the limiting groove so as to rotate relative to the male terminal body or the female terminal body.

8. The waterproof terminal assembly according to claim 7, further comprising at least one elastic pad received in the limiting groove, wherein one of two sides of the elastic pad is abutted against the first socket or the second socket, and the other side of the elastic pad is abutted against the inner wall of the limiting groove.

9. A continuable waterproof power module, comprising:

a housing;

a battery core received in the housing; and the waterproof terminal assembly according to claim 1, wherein the male terminal is disposed at a first side of the housing, the female terminal is disposed at the first side or a second side of the housing, wherein the second side is not opposite to the first side, the male terminal and the female terminal are electrically connected to the battery core.

10. A continuable waterproof power module, comprising:

a housing;

a battery core received in the housing; and the waterproof terminal assembly according to claim 2, wherein the male terminal is disposed at a first side of the housing, the female terminal is disposed at the first side or a second side of the housing, wherein the second side is not opposite to the first side, the male terminal and the female terminal are electrically connected to the battery core.

11. A continuable waterproof power module, comprising:

a housing;

a battery core received in the housing; and the waterproof terminal assembly according to claim 3, wherein the male terminal is disposed at a first side of the housing, the female terminal is disposed at the first side or a second side of the housing, wherein the second side is not opposite to the first side, the male terminal and the female terminal are electrically connected to the battery core.

12. A continuable waterproof power module, comprising:

a housing;

a battery core received in the housing; and the waterproof terminal assembly according to claim 4, wherein the male terminal is disposed at a first side of the housing, the female terminal is disposed at the first side or a second side of the housing, wherein the second side is not opposite to the first side, the male terminal and the female terminal are electrically connected to the battery core.

13. A continuable waterproof power module, comprising:

a housing;

a battery core received in the housing; and the waterproof terminal assembly according to claim 5, wherein the male terminal is disposed at a first side of the housing, the female terminal is disposed at the first side or a second side of the housing, wherein the second side is not opposite to the first side, the male terminal and the female terminal are electrically connected to the battery core.

14. A continuable waterproof power module, comprising:

a housing;

a battery core received in the housing; and the waterproof terminal assembly according to claim 6, wherein the male terminal is disposed at a first side of the housing, the female terminal is disposed at the first side or a second side of the housing, wherein the second side is not opposite to the first side, the male terminal and the female terminal are electrically connected to the battery core.

15. A continuable waterproof power module, comprising:
a housing;
a battery core received in the housing; and
the waterproof terminal assembly according to claim 7, wherein the male terminal is disposed at a first side of the housing, the female terminal is disposed at the first side or a second side of the housing, wherein the second side is not opposite to the first side, the male terminal and the female terminal are electrically connected to the battery core.

16. A continuable waterproof power module, comprising:
a housing;
a battery core received in the housing; and
the waterproof terminal assembly according to claim 8, wherein the male terminal is disposed at a first side of the housing, the female terminal is disposed at the first side or a second side of the housing, wherein the second side is not opposite to the first side, the male terminal and the female terminal are electrically connected to the battery core.

17. A continuable waterproof cable, comprising:
the waterproof terminal assembly according to claim 1; and
a cable body, having a connecting end and a continuing end opposite to the connecting end, wherein the connecting end is connected to the male terminal and the continuing end is connected to the female terminal.

18. The continuable waterproof cable according to claim 17, wherein the continuable waterproof cable is adapted to a male terminal of a first mating structure, the male terminal of the first mating structure comprises a male terminal body, a first transmitting member, and a free transmitting member, the first transmitting member is exposed out of an end portion of the male terminal body, and the free transmitting member is detachably coupled to the first transmitting member, wherein when the continuable waterproof cable is connected to the male terminal of the first mating structure, the first transmitting member of the first mating structure is connected to the second transmitting member of the continuable waterproof cable, and the second transmitting member of the continuable waterproof cable pushes the free transmitting member of the first mating structure apart from the first transmitting member of the first mating structure so that the free transmitting member of the first mating structure is coupled to the fixed transmitting member of the first mating structure, the second waterproof elastic member of the continuable waterproof cable is attached to the end portion of the male terminal body of the first mating structure, such that the continuing end of the cable body is connected to the end portion of the male terminal body of the first mating structure.

19. The continuable waterproof cable according to claim 18, further comprising a waterproof elastomer at the continuing end and placed on the second transmitting member, wherein the waterproof elastomer defines a channel therethrough, the inner diameter of the channel is less than the outer diameter of the first transmitting member of the first mating structure, wherein when the continuable waterproof cable is connected to the male terminal of the first mating structure, the first transmitting member is inserted into the channel of the waterproof elastomer, and the periphery of the first transmitting member is enclosed by the inner wall of the channel of the waterproof elastomer.

20. The continuable waterproof cable according to claim 18, further comprising a flexible compressible member fitted over the fixed transmitting member of the first mating structure, wherein when the continuable waterproof cable is connected to the male terminal of the first mating structure, the flexible compressible member is compressed inward along the fixed transmitting member of the continuable waterproof cable.

21. The continuable waterproof cable according to claim 18, wherein the continuable waterproof cable is adapted to a female terminal of a second mating structure, the female terminal of a second mating structure comprises a female terminal body, a second transmitting member, and a fixed transmitting member, the second transmitting member is disposed at an end portion of the female terminal body, and the fixed transmitting member is at the end portion of the female terminal body and spaced from the second transmitting member, wherein when the continuable waterproof cable is connected to the female terminal of the second mating structure, the second transmitting member of the second mating structure is connected to the first transmitting member of the continuable waterproof cable, and the second transmitting member of the second mating structure pushes the free end apart from the first transmitting member of the continuable waterproof cable so that the free terminal member of the continuable waterproof cable is coupled to the fixed transmitting member of the second mating structure, the first waterproof elastic member of the continuable waterproof cable is attached to the end portion of the female terminal body of the second mating structure, such that the connecting end of the cable body is connected to the end portion of the female terminal body of the second mating structure.

22. The continuable waterproof cable according to claim 21, further comprising a first socket and a second socket, wherein the first socket is fitted over the outer periphery of the connecting end or the outer periphery of the end portion of the male terminal body of the first mating structure, the second socket is fitted over the outer periphery of the continuing end or the outer periphery of the end portion of the female terminal body of the second mating structure, and wherein the inner diameter of the first socket is substantially equal to the outer diameter of the second socket.

23. The continuable waterproof cable according to claim 22, further comprising a first elastic pad and a second elastic pad, wherein the first elastic pad is disposed at the inner wall of the first socket, the second elastic pad is disposed at the outer wall of the second socket, wherein when the continuing end of the cable body is connected to the end portion of the male terminal body of the first mating structure, the second elastic pad of the cable body is abutted against the first socket of the male terminal body of the first mating structure, and wherein when the connecting end of the cable body is connected to the end portion of the female terminal body of the second mating structure, the first elastic pad of the cable body is abutted against the second socket of the female terminal body of the second mating structure.

24. The continuable waterproof cable according to claim 17, wherein the connecting end comprises a positioning portion at the center of the connecting end to receive the first transmitting member and the free transmitting member, and wherein the continuing end comprises a limiting portion and a slot, the limiting portion is at the center of the continuing end to be adapted to the positioning portion of the connecting end, and the slot is defined at the center of the limiting portion to receive the second transmitting member and the fixed transmitting member.

25. The continuable waterproof cable according to claim 17, wherein the connecting end comprises a limiting portion and a slot, the limiting portion is at the center of the connecting end, the slot is defined at the center of the limiting portion to receive the first transmitting member and the free transmitting member, and wherein the continuing end comprises a positioning portion at the center of the continuing end to receive the second transmitting member and the fixed transmitting member and to be adapted to the limiting portion of the connecting end.

26. The continuable waterproof cable according to claim 17, further comprising a first socket and a second socket, wherein the first socket is fitted over the outer periphery of the connecting end, the second socket is fitted over the outer periphery of the continuing end, and wherein the inner diameter of the first socket is substantially equal to the outer diameter of the second socket.

27. The continuable waterproof cable according to claim 26, wherein the first socket further comprises a first securing portion defined around the inner wall thereof, the second socket further comprises a second securing portion defined around the outer wall thereof, and the first securing portion is adapted to the second securing portion.

28. The continuable waterproof cable according to claim 26, wherein at least one of the first socket and the second socket is fixedly fitted over the cable body.

29. The continuable waterproof cable according to claim 26, wherein at least one of the continuing end and the connecting end defines a limiting groove around the periphery thereof, at least one of the first socket and the second socket is engaged in the limiting groove so as to rotate relative to the cable body.

30. The continuable waterproof cable according to claim 29, further comprising at least one elastic pad received in the limiting groove, wherein one of two sides of the elastic pad is abutted against the first socket or the second socket, and the other side of the elastic pad is abutted against the inner wall of the limiting groove.

31. The continuable waterproof cable according to claim 17, further comprising an insulating member, arranged between the second transmitting member and the fixed transmitting member.

* * * * *